US006226662B1

(12) United States Patent
Mou

(10) Patent No.: US 6,226,662 B1
(45) Date of Patent: *May 1, 2001

(54) SIGNAL INTERPOLATION AND DECIMATION EXPLOITING FILTER SYMMETRY

(75) Inventor: Alex Zhi-Jian Mou, Sunnyvale, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/285,807

(22) Filed: Apr. 1, 1999

Related U.S. Application Data

(63) Continuation of application No. 08/673,489, filed on Jul. 1, 1996, now Pat. No. 5,892,693.

(51) Int. Cl.[7] ...................................... G06F 17/17
(52) U.S. Cl. ............................................. 708/313
(58) Field of Search ................................... 708/300, 301, 708/302, 313, 315, 319, 322, 323

(56) References Cited

U.S. PATENT DOCUMENTS 4,064,397    12/1977    Sakaki et al. .

(List continued on next page.)

FOREIGN PATENT DOCUMENTS 0 548 917    6/1993    (EP) .

OTHER PUBLICATIONS

Chen et al., "New Efficient Interpolation Algorithm and its Realizations," IEEE 1994, pp. 406–411.

(List continued on next page.)

*Primary Examiner*—Chuong Dinh Ngo
(74) *Attorney, Agent, or Firm*—Conley, Rose & Tayon, PC; B. Noël Kivlin

(57) ABSTRACT

Symmetry in a filter is used to reduce the complexity of an interpolator or a decimator and to simplify derivation of resulting discrete samples. In particular, a weight filter matrix which includes L=(N−1)M+K weights is divided into two sub-filters, the first having L1=NK weights and the second having L2=(N−1)(M−K). In the case of interpolators, N source samples are applied to the first weight sub-filter to produce K interpolated signals and N−1 source samples are applied to the second weight sub-filter to produce M−K interpolated signals. In the case of decimators, K source samples are applied to the first weight sub-filter to produce N decimated sample components and M−K source samples are applied to the second weight sub-filter to produce N−1 decimated sample components. If the weight filter matrix is centrosymmetric, both sub-filters are also centrosymmetric. Symmetry in the weights of each sub-filter is recognized and exploited. Within each sub-filter, an inverse relationship between weights applied to two samples is recognized and exploited. An inverse relationship is recognized when a first weight is associated with a first of the samples and a second weight is associated with a second of the samples and a weight which is equivalent to the first weight is associated with the second sample and a weight which is equivalent to the second weight is associated with the first sample. The inverse relationship is exploited by forming two composite weights of the first and second weights and weighting composite sample signals with the composite weights. A first of the composite weights has a value which is one-half of the sum of the values of the first and second weights. A second of the composite weights has a value which is one-half of the difference of the values of the first and second weights. The composite weights can be used repeatedly for each subsequent interpolation or decimation and are therefore calculated only once for processing many samples according to the same filter. The two composite samples have values which are, respectively, (i) the sum of the values of the first and second samples and (ii) the difference of the values of the first and second samples.

20 Claims, 9 Drawing Sheets

U.S. PATENT DOCUMENTS

| | | |
|---|---|---|
| 4,692,909 | 9/1987 | Gard et al. . |
| 4,843,581 | 6/1989 | Cupo et al. . |
| 4,852,035 | 7/1989 | Michener . |
| 4,856,030 | 8/1989 | Batzer et al. . |
| 4,862,403 | 8/1989 | Iwase et al. . |
| 5,124,806 | 6/1992 | Heitmann . |
| 5,258,939 | 11/1993 | Johnstone et al. . |
| 5,260,888 | 11/1993 | Sharman . |
| 5,262,970 | 11/1993 | Sevenhans et al. . |
| 5,339,264 | 8/1994 | Said et al. . |
| 5,566,101 | 10/1996 | Kodra . |
| 5,587,939 | 12/1996 | Soleymani et al. . |
| 5,594,675 | 1/1997 | Peng . |
| 5,600,318 | 2/1997 | Li . |
| 5,729,483 | 3/1998 | Brown . |

OTHER PUBLICATIONS

Mou et al., "Short–Length FIR Filters and Their Use in Fast Nonrecursive Filtering," IEEE Transactions on Acoustics, Speech, and Signal Processing, vol. 39, No. 6, Jun. 1991, pp. 1322–1332.

De Man et al., "Linear Phase Decimation and Interpolation Filters for High–Speed Applications," Electronic Letters, vol. 24, No. 12, Jun. 1988, pp. 757–759.

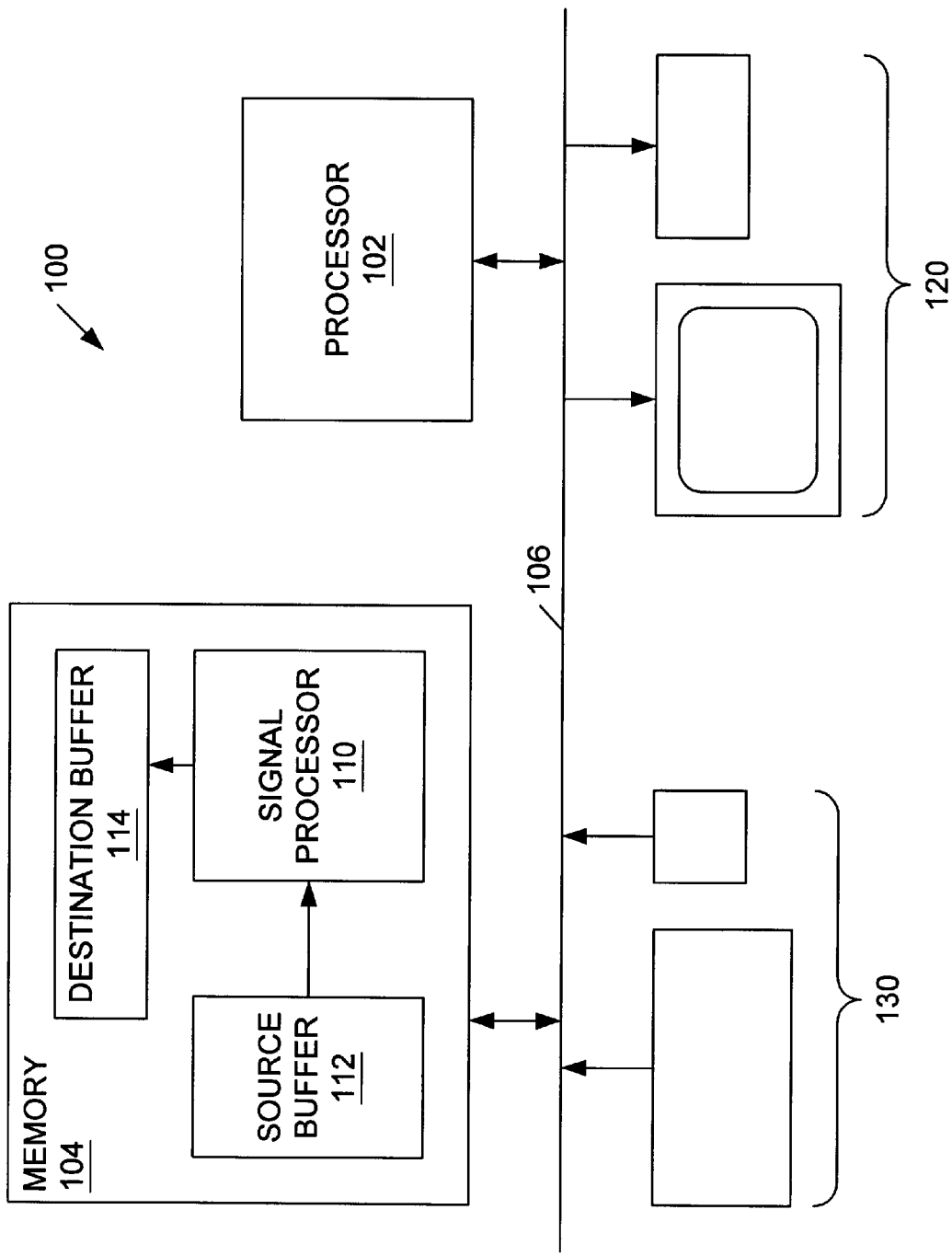

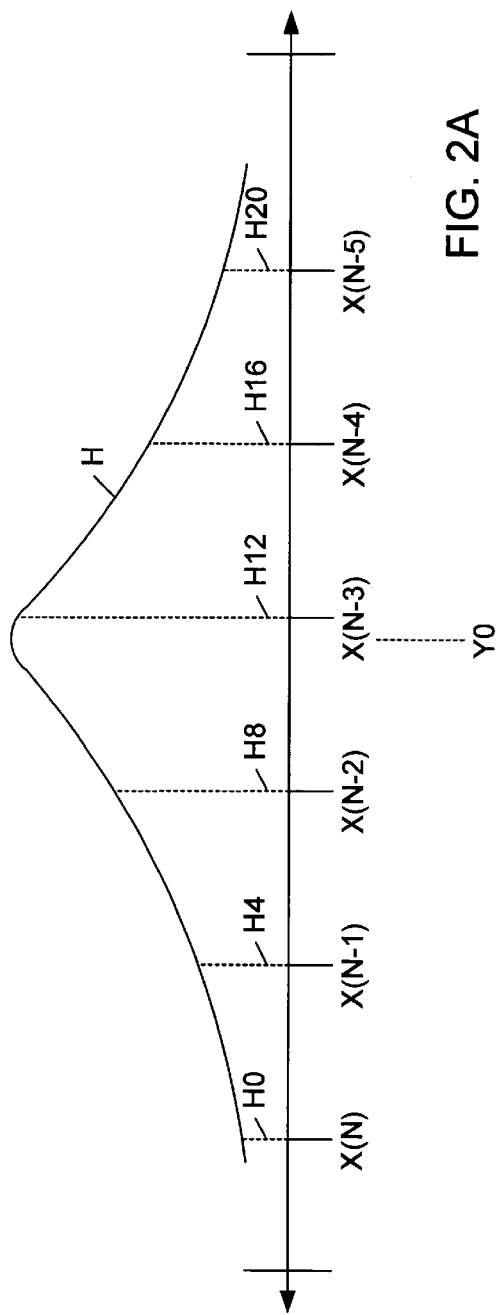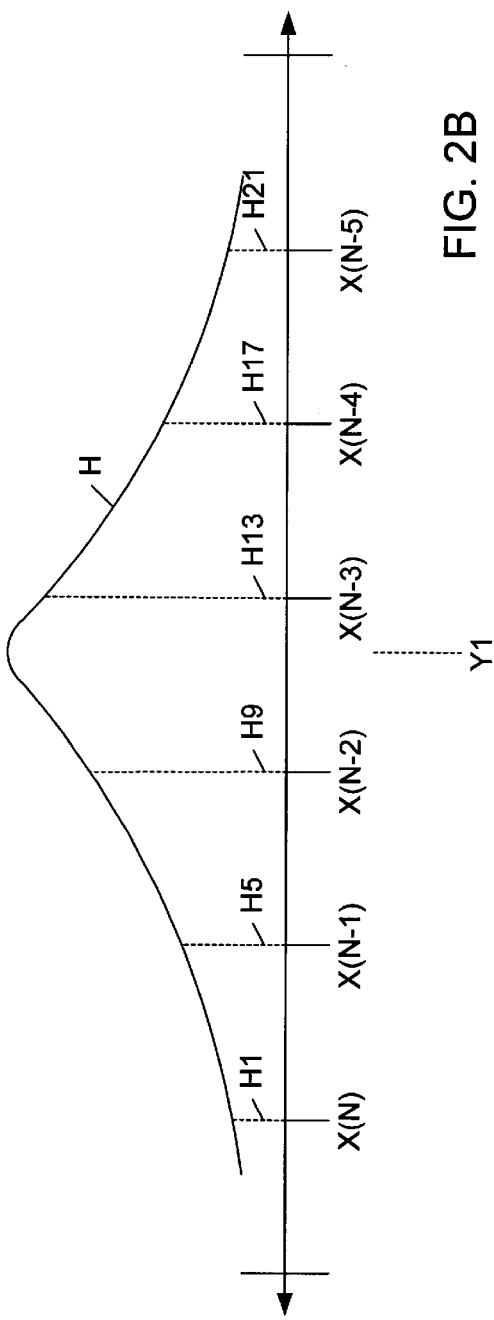

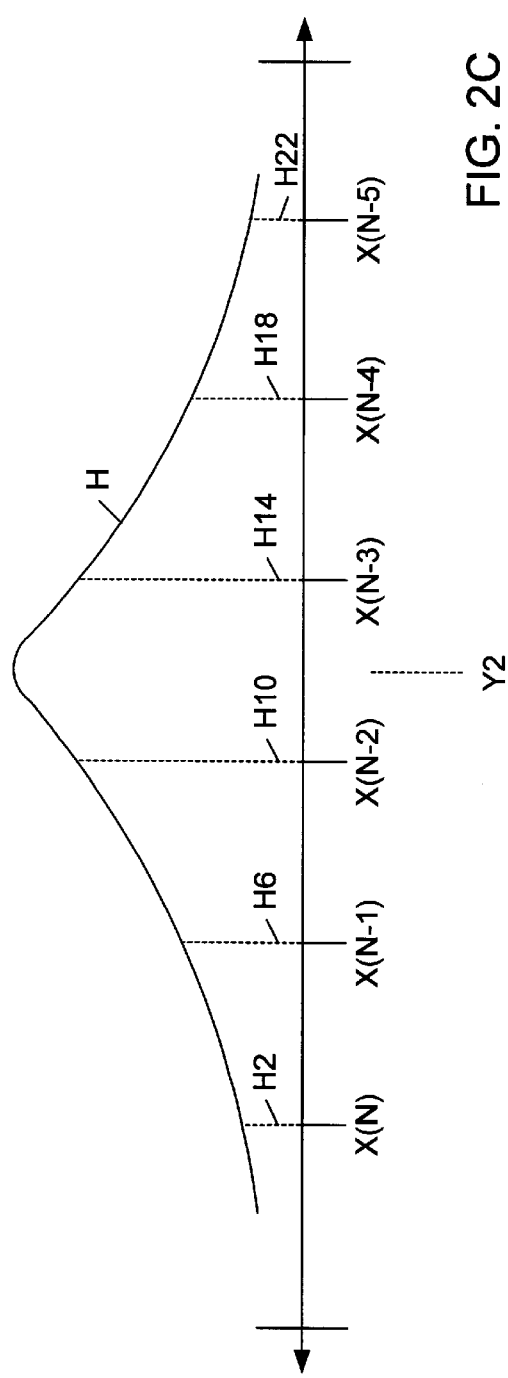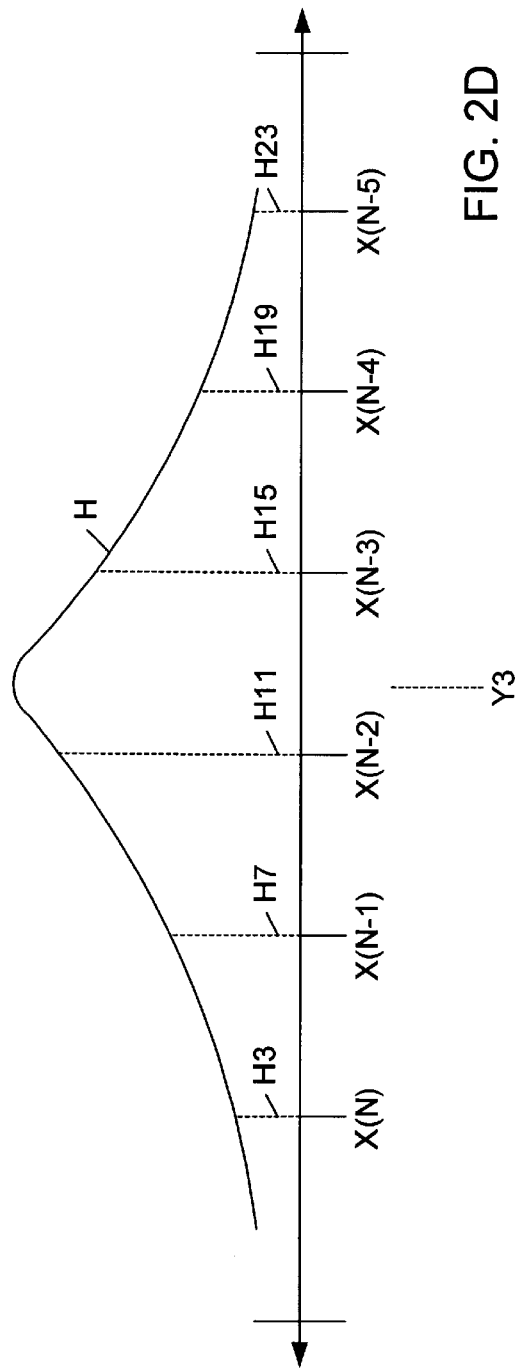

SIGNAL INTERPOLATION AND DECIMATION EXPLOITING FILTER SYMMETRY

SPECIFICATION

This is a continuation of U.S. patent application Ser. No. 08/673,489 filed Jul. 1, 1996 now U.S. Pat. No. 5,892,693.

FIELD OF THE INVENTION

The present invention relates to signal processing in a computer system and, in particular, to a particularly efficient mechanism for interpolating and decimating discrete samples of an analog signal.

BACKGROUND OF THE INVENTION

Signal interpolation and signal decimation are forms of signal processing which require substantial resource in terms of computer resources and/or circuitry. Signal interpolation and decimation involve discrete samples of an analog signal generally taken at a specific frequency. Signal interpolation produces synthesized discrete signals of the analog signal at a greater frequency. For example, discrete samples of an analog audio signal taken at a frequency of 20 MHz can be interpolated by a 1-to-2 signal interpolator to produce synthesized discrete samples of the analog audio signal at 40 MHz. Signal decimation produces synthesized discrete signals of the analog signal at a lesser frequency.

Signal interpolators and decimators are used to process discrete samples of various types of analog signals to produce discrete samples of the analog signal at various frequencies. For example, signal interpolators and decimators can process discrete samples of an analog seismic signal recorded using a vibration source and one or more geophones in a conventional manner. Alternatively, signal interpolators and decimators can process discrete samples of an analog light signal, i.e., pixels of a color graphical image, recorded by a video camera. Furthermore, signal interpolators and decimators can process discrete samples of an analog audio recording. The discrete samples are typically taken from a source analog signal using an analog-to-digital converter, which converts a particular value of the analog signal at a particular time to a digital number which can be stored in the memory of a computer.

Signal interpolation and decimation typically requires significant amounts of processing resources due in part to the complexity of filters used in interpolation and decimation and due in part to the substantial number of discrete samples processed. A filter is generally a number of weights which are applied to each of a number of discrete samples. The weights are generally referred to as a filter since the weights are applied to various collections of discrete samples. For example, a filter which has twenty-four weights is generally applied, first, to the first through twenty-fourth discrete samples; second, to the second through twenty-fifth discrete samples; third, to the third through twenty-sixth samples; and so on. In the case of a signal interpolator which has twenty-four weights, twenty-four multiplication operations and twenty-three addition operations are required to produce a synthesized discrete sample. Similarly, in the case of a signal decimator which has twenty-four weights, twenty-four multiplication operations and twenty-three addition operations are required to process an original discrete sample of the analog signal.

Signals which are interpolated or decimated typically include substantial numbers of discrete samples. For example, seismic data can involve scores of lines of seismic data, each line representing a path along the surface of the earth and each line including a thousand seismic traces or more. A seismic trace can in turn include thousands of discrete samples of an analog seismic signal measured at a specific point on the surface of the earth. Therefore, a seismic signal can easily include scores of millions of discrete samples. In another example, it is common today for graphical images to have one-thousand or more columns and one-thousand or more rows of picture elements, i.e., pixels, each of which is a discrete sample of a video signal. Such a video signal can be recorded using a video camera, an optical scanner, or can be generated by a computer to represent physical objects defined in part through physical manipulation of computer input devices by a user. Thus, it is common for a graphical image to include a million or more discrete samples of a video image. In addition, motion video signals can include thousands of frames, each of which can include a million or more discrete samples. Accordingly, interpolation or decimation of such seismic or video signals involves processing of millions of signals. Efficiency in a signal interpolator or decimator is therefore highly desirable to reduce the amount of time and resources required to process such signals.

In addition, it is frequently desirable to interpolate or decimate signals very rapidly. For example, a compact disc player typically reads discrete samples of an analog audio signal at a rate of more than 40 million discrete samples per second. To enhance the sound quality of an analog audio signal reproduced from the discrete samples, additional discrete samples are interpolated from the discrete samples retrieved from the compact disc. Such an interpolator must generally process the discrete samples at a rate which is at least the rate at which the discrete samples are retrieved, i.e., at least 40 million discrete samples per second.

Because of the significant processing resources required for such signal interpolation and decimation, a need persists in the industry for ever increasing efficiency in signal interpolators and decimators.

SUMMARY OF THE INVENTION

In accordance with the present invention, symmetry in sub-filters of a weight filter is recognized and exploited to reduce the complexity of an interpolator or a decimator and to simpliiy derivation of resulting discrete samples. In particular, a weight filter matrix which includes L=(N−1) M+K weights is divided into two sub-filters, the first having L1=NK weights and the second having L2=(N−1)(M−K). In the case of interpolators, N source samples are applied to the first weight sub-filter to produce K interpolated signals and N−1 source samples are applied to the second weight sub-filter to produce M−K interpolated signals. In the case of decimators, K source samples are applied to the first weight sub-filter to produce N decimated sample components and M−K source samples are applied to the second weight sub-filter to produce N−1 decimated sample components. If the weight filter matrix is centrosymmetric, both sub-filters are also centrosymmetric. Symmetry in the weights of each sub-filter is recognized and exploited.

Within each sub-filter, additive complexity is reduced when an inverse relationship between weights applied to two samples is recognized and exploited. An inverse relationship is recognized when (i) a first weight is associated with a first of the samples and a second weight is associated with a second of the samples in the derivation of a first resulting sample, and (ii) a weight which is equivalent to the first weight is associated with the second sample and a weight which is equivalent to the second weight is associated with the first sample in a derivation of a second resulting sample. The inverse relationship is exploited by forming two composite weights of the first and second weights and weighting composite sample signals with the composite weights. A first of the composite weights has a value which is one-half of the sum of the values of the first and second weights. A second of the composite weights has a value which is one-half of the difference of the values of the first and second weights. The composite weights can be used repeatedly for each subsequent interpolation or decimation and are therefore calculated only once for processing many samples according to the same filter. The two composite samples have values which are, respectively, (i) the sum of the values of the first and second samples and (ii) the difference of the values of the first and second samples. Since only two composite weights are involved, two multipliers are required rather than four in which the first and second samples are weighted by the first and second weights, respectively, and by the second and first weights, respectively. The number of required adders is also reduced significantly as described more completely below.

The number of required adders is further reduced in accordance with the present invention by using a single adder to produce two intermediate signals corresponding to respective sums of two pairs of source samples. The adder is used during one time interval to produce the first of the intermediate signals and during a subsequent time interval to produce the second of the intermediate signals. The two intermediate signals are combined in the production of a resulting sample by producing a signal corresponding to the first intermediate signal, delaying for a time interval, producing a signal corresponding to the second intermediate signal, and applying the signals corresponding to the intermediate signals to an adder which produces a signal representing the sum of the values of the two signals. As a result, the number of adders required to produce a number of resulting signals can be reduced substantially. Accordingly, interpolators and decimators according to the present invention represent a signal improvement in the efficiency of such interpolation and decimation.

BRIEF DESCRIPTION OF THE DRAWINGS

FIG. 1 is a block diagram of a computer system which includes a signal processor in accordance with the present invention.

FIGS. 2A–D illustrate a weight filter H as applied to source discrete samples X in interpolating samples Y.

DETAILED DESCRIPTION

Figure 3:
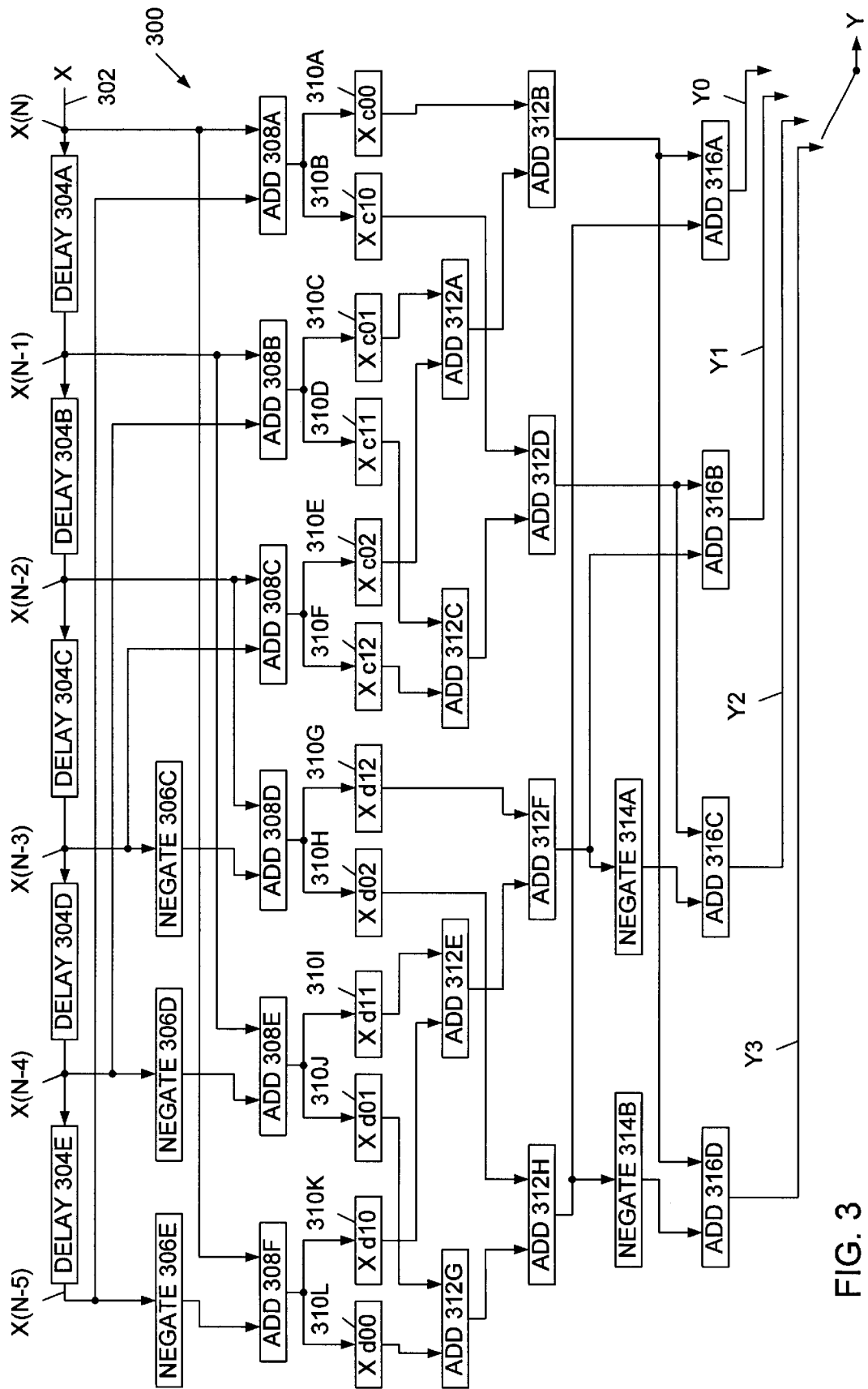
FIG. 3 is a block diagram of a 1-to-4 interpolator in accordance with the present invention.

In accordance with the present invention, symmetry in a filter is used to reduce the complexity of an interpolator or a decimator and to simplify derivation of resulting discrete samples.

Hardware Components of the Image Processing System

To facilitate appreciation of the present invention, hardware components of one embodiment of a signal processing system in accordance with the present invention are briefly described. Computer system 100 (FIG. 1) includes a processor 102 and memory 104 which is coupled to processor 102 through a bus 106. Processor 102 fetches from memory 104 computer instructions and executes the fetched computer instructions. Processor 102 also reads data from and writes data to memory 104 and sends data and control signals through bus 106 to one or more computer display devices 120 in accordance with fetched and executed computer instructions. Processor 102 can be, for example, any of the SPARC processors available from Sun Microsystems, Inc. of Mountain View, Calif.

Memory 104 can include any type of computer memory and can include, without limitation, randomly accessible memory (RAM), read-only memory (ROM), and storage devices which include storage media such as magnetic and/or optical disks. Memory 104 includes a signal processor 110, which is a computer process executing within processor 102 from memory 104. A computer process is a collection of computer instructions and data which collectively define a task performed by computer system 100. As described more completely below, signal processor 110 (i) reads discrete source samples corresponding to a particular sampling frequency from a source buffer 112, (ii) derives from the discrete source samples new discrete resulting samples corresponding to a different sampling frequency, and (iii) stores those new discrete resulting samples in destination buffer 114.

Each of computer display devices 120 can be any type of computer display device including without limitation a printer, a cathode ray tube (CRT), a light-emitting diode (LED) display, or a liquid crystal display (LCD). Each of computer display devices 120 receives from processor 102 control signals and data and, in response to such control signals, displays the received data. Computer display devices 120, and the control thereof by processor 102, are conventional.

Computer system 100 can be any of the SPARCstation workstation computers available from Sun Microsystems, Inc. of Mountain View, Calif. Sun, Sun Microsystems, and the Sun Logo are trademarks or registered trademarks of Sun Microsystems, Inc. in the United States and other countries. All SPARC trademarks are used under license and are trademarks of SPARC International, Inc. in the United States and other countries. Products bearing SPARC trademarks are based upon an architecture developed by Sun Microsystems, Inc.

Source buffer 112 and destination buffer 114 are stored in memory 104 and each contain discrete samples of an analog signal. For example, source buffer 112 can include discrete samples taken at a source sampling frequency from an analog seismic signal recorded using a vibration source and one or more geophones in a conventional manner. Alternatively, source buffer 112 can include discrete samples of an analog light signal, i.e., pixels of a color graphical image. Furthermore, source buffer 112 can include discrete samples taken at a source sampling frequency from an analog audio recording. The discrete samples of source buffer 112 are typically taken from a source analog signal using an analog-to-digital converter, which converts a particular value of the analog signal at a particular time to a digital number which can be stored in memory 104. The discrete samples are typically taken from the analog signal at a source sampling frequency such that the discrete samples represent values of the analog signal at regular time intervals. Destination buffer 114 generally includes discrete samples, which are derived by signal processor 110 from discrete source samples of source buffer 112 and which represent values of the analog signal corresponding to a different, destination sampling frequency.

1-to-N Interpolation

Prior to describing specific efficiencies and benefits of the present invention, a brief discussion of interpolation is helpful. FIGS. 2A–D illustrate a 1-to-4 interpolation. A weight filter H FIG. 2A) specifies relative weights for various discrete source samples of source buffer 112 (FIG. 1). In this example, weight filter H (FIG. 2A) includes 24 discrete weights H0–23. In FIG. 2A, weight filter H is centered over destination sample Y0, which is to be interpolated from source samples X(N), X(N−1), X(N−2), X(N−3), X(N−4), and X(N−5). The value of destination sample Y0 is calculated by summing the values of source samples X(N), X(N−1), X(N−2), X(N−3), X(N−4), and X(N−5) as weighted by corresponding weights of weight filter H. As shown in FIG. 2A, weights H0, H4, H8, H12, H16, and H20 are aligned with source samples X(N), X(N−1), X(N−2), X(N−3), X(N−4), and X(N−5), respectively. Therefore, the value assigned to destination sample Y0 is determined by the following equation.

$$Y0=X(N) \cdot H0+X(N-1) \cdot H4+X(N-2) \cdot H8+X(N-3) \cdot H12+X(N-4) \cdot H16+X(N-5) \cdot H20 \quad (1)$$

FIG. 2B shows the derivation of a second destination sample Y1 from source samples X(N), X(N−1), X(N−2), X(N−3), X(N−4), and X(N−5). In FIG. 2B, weight filter H is moved to the left from the position of weight filter H in FIG. 2A by an amount equal to the time interval between destination samples Y0 and Y1. As shown in FIG. 2B, weights H1, H5, H9, H13, H17, and H21 are aligned with source samples X(N), X(N−1), X(N−2), X(N−3), X(N−4), and X(N−5), respectively. Therefore, the value assigned to destination sample Y1 is determined by the following equation.

$$Y1=X(N) \cdot H1+X(N-1) \cdot H5+X(N-2) \cdot H9+X(N-3) \cdot H13+X(N-4) \cdot H17+X(N-5) \cdot H21 \quad (2)$$

FIG. 2C shows the derivation of a third destination sample Y2 from source samples X(N), X(N−1), X(N−2), X(N−3), X(N−4), and X(N−5). In FIG. 2C, weight filter H is moved to the left from the position of weight filter H in FIG. 2B by an amount equal to the time interval between destination samples Y1 and Y2. As shown in FIG. 2C, weights H2, H6, H10, H14, H18, and H22 are aligned with source samples X(N), X(N−1), X(N−2), X(N−3), X(N−4), and X(N−5), respectively. Therefore, the value assigned to destination sample Y2 is determined by the following equation.

$$Y2=X(N) \cdot H2+X(N-1) \cdot H6+X(N-2) \cdot H10+X(N-3) \cdot H14+X(N-4) \cdot H18+X(N-5) \cdot H22 \quad (3)$$

FIG. 2D shows the derivation of a fourth destination sample Y3 from source samples X(N), X(N−1), X(N−2), X(N−3), X(N−4), and X(N−5). In FIG. 2D, weight filter H is moved to the left from the position of weight filter H in FIG. 2C by an amount equal to the time interval between destination samples Y2 and Y3. As shown in FIG. 2D, weights H3, H7, H11, H15, H19, and H23 are aligned with source samples X(N), X(N−1), X(N−2), X(N−3), X(N−4), and X(N−5), respectively. Therefore, the value assigned to destination sample Y3 is determined by the following equation.

$$Y3=X(N) \cdot H3+X(N-1) \cdot H7+X(N-2) \cdot H11+X(N-3) \cdot H15+X(N-4) \cdot H19+X(N-5) \cdot H23 \quad (4)$$

Weight filter H is typically symmetrical, i e., weights H0, H1, H2, H3, H4, H5, H6, H7, H8, H9, H10, and H11 are equal to weights H23, H22, H21, H20, H19, H18, H17, H16, H15, H14, H13, and H12, respectively. In such a case, equations (1) through (4) are equivalent to equations (5) through (8), respectively.

$$Y0=X(N) \cdot H0+X(N-1) \cdot H4+X(N-2) \cdot H8+X(N-3) \cdot H11+X(N-4) \cdot H7+X(N-5) \cdot H3 \quad (5)$$

$$Y1=X(N) \cdot H1+X(N-1) \cdot H5+X(N-2) \cdot H9+X(N-3) \cdot H10+X(N-4) \cdot H6+X(N-5) \cdot H2 \quad (6)$$

$$Y2=X(N) \cdot H2+X(N-1) \cdot H6+X(N-2) \cdot H10+X(N-3) \cdot H9+X(N-4) \cdot H5+X(N-5) \cdot H1 \quad (7)$$

$$Y3=X(N) \cdot H3+X(N-1) \cdot H7+X(N-2) \cdot H11+X(N-3) \cdot H8+X(N-4) \cdot H4+X(N-5) \cdot H0 \quad (8)$$

Equations (5) through (8) is equivalent to the following equation (9).

$$\begin{bmatrix} Y0 \\ Y1 \\ Y2 \\ Y3 \end{bmatrix} = \begin{bmatrix} H0 & H4 & H8 & H11 & H7 & H3 \\ H1 & H5 & H9 & H10 & H6 & H2 \\ H2 & H6 & H10 & H9 & H5 & H1 \\ H3 & H7 & H11 & H8 & H4 & H0 \end{bmatrix} \begin{bmatrix} X(N) \\ X(N-1) \\ X(N-2) \\ X(N-3) \\ X(N-4) \\ X(N-5) \end{bmatrix} \quad (9)$$

Calculating interpolated values for Y0–Y3 in a straight forward, conventional manner according to equation (9) requires twenty-four multipliers and twenty adders. However, it is observed that weight H0 is multiplied by sample X(N) and by sample X(N−5). In addition, weight H3 is also multiplied by samples X(N) and X(N−5). More specifically, H0·X(N)+H3·X(N−5) is a component of interpolated sample Y0, and H3·X(N)+H0·X(N−5) is a component of interpolated sample Y3. Together, these components require four (4) multipliers and two (2) adders. However, it is further observed that H0·X(N) +H3·X(N−5) is equivalent to (H0+H3)(X(N)+X(N−5))+(H0−H3)(X(N)−X(N−5))/2. Similarly, H3·X(N) +H0·X(N−5) is equivalent to (H0+H3)(X(N)+X(N−5))−(H0−H3)(X(N)−X(N−5))/2. The values (H0+H3)/2 and (H0−H3)/2 recur in both components. Weights H0–H23 of weight filter H generally remain unchanged during the derivation of interpolated samples of destination buffer 114 from all of the source samples of source buffer 112. Therefore, weights whose respective values are (H0+H3)/2 and (H0−H3)/2 can be precomputed and stored in registers within processor 102 or as data in memory 104 as composite weights c00 and d00.

Accordingly, components H0·X(N)+H3·X(N−5) and H3·X(N)+H0·X(N−5) are equivalent to (X(N)+X(N−5)) ·c00+(X(N)−X(N−5))·d00 and (X(N)+X(N−5))·c00−(X(N)−X(N−5))·d00, respectively. Since (X(N)+X(N−5))·c00 is included in both components, (X(N)+X(N−5))·c00 is calculated once and used twice to form each of the two components. Similarly, (X(N)−X(N−5))·d00 is included in both components and is calculated once and used twice to form each of the two components. Derivation of these components therefore requires two (2) multipliers and four (4) adders.

At first glance, it appears that the overall complexity of an interpolator designed in accordance with equation (9) is not improved since four (4) multipliers in combination with two (2) adders is replaced with two (2) multipliers in combination with four (4) adders. However, two of the four (4) adders can be used to produce other components of interpolated signals produced in accordance with equation (9). For example, weight H1 is multiplied by sample X(N) and by sample X(N−5) and, weight H2 is also multiplied by samples X(N) and X(N−5). More specifically, H1·X(N)+H2·X(N−5) is a component of interpolated sample Y1, and H2·X(N)+H1·X(N−5) is a component of interpolated sample Y2. H1·X(N)+H2·X(N−5) is equivalent to (H1+H2)(X(N)+X(N−5))+(H1−H2)(X(N)−X(N−5))/2. Similarly, H2·X(N)+H1·X(N−5) is equivalent to (H1+H2)(X(N)+X(N−5))−(H1−H2)(X(N)−X(N−5))/2. The values (H1+H2)/2 and (H1−H2)/2 recur in both components. Weights whose respective values are (H1+H2)/2 and (H1−H2)/2 can be precomputed and stored in registers within processor 102 or as data in memory 104 as composite weights c10 and d10. Accordingly, components H1·X(N)+H2·X(N−5) and H1·X(N)+H2·X(N−5) are equivalent to (X(N)+X(N−5))·c10+(X(N)−X(N−5))·d10 and (X(N)+X(N−5))·c10−(X(N)−X(N−5))·d10, respectively. Since intermediate signals having respective values of (X(N)+X(N−5)) and (X(N)−X(N−5)) are produced in the production of interpolated samples Y0 and Y3 as described above, those same intermediate signals can also be used is producing interpolated signals Y1 and Y2. Specifically, the production of the components of interpolated samples Y0–Y3 which involve source samples X(N) and X(N−5) collectively require four (4) multipliers and six (6) adders.

In conventional interpolators designed in accordance with equation (9) in a straight-forward manner require eight (8) multipliers and four (4) adders to produce components of interpolated samples Y0–Y3 which involve source samples X(N) and X(N−5). As described below with respect to Tables C and D, that interpolators and decimators in accordance with the present invention reduce the number of required multipliers to approximately 50% of the length of a weight filter H and reduce the number of required adders asymptotically to approximately 50% of the length of a weight filter H.

Equation (9) above is therefore equivalent to the following equation.

second weight, are symmetrical if the weights are equivalent and if, in calculating one interpolated sample, the first and second weights correspond to first and second source samples, respectively, and, in calculating another interpolated sample, the first and second weights correspond to the second and first source samples, respectively.

A four-to-one interpolator 300 (FIG. 3) interpolates four interpolated samples Y0–Y3 from six source samples X(N) through X(N−5) according to equation (9) above. Source samples are received at terminal 302. At any given time, the signal received at terminal 302 represents source sample X(N). A series of delay units 304A–E preserve prior signals received at terminal 302 to thereby record source samples X(N−1), X(N−2), X(N−3), X(N−4), and X(N−5) which are produced on respective outputs of delay units 304A–E, respectively. Each of delay units 304A–E can be, for example, a shift register realized in processor 102 or in other circuitry or an item in a list stored in memory 104 (FIG. 1). Negating circuitry 306C–E (FIG. 3) receive from delay units 304C–E, respectively, source samples X(N−3), X(N−4), and X(N−5), respectively. Negating circuitry 306C–E produce signals which are the result of negating source samples X(N−3), X(N−4), and X(N−5), respectively.

Interpolator 300 also includes adders 308A–F which produce signals representing the values (i) X(N)+X(N−5), (ii) X(N−1)+X(N−4), (iii) X(N−2)+X(N−3), (iv) X(N−2)−X(N−3), (v) X(N−1)−X(N−4), and (vi) X(N)−X(N−5), respectively. For example, adder 308A receives from terminal 302 source sample X(N) and from delay unit 302E source sample X(N−5) and produces a signal representing the sum of source samples X(N) and X(N−5). As a second example, adder 308F receives from terminal 302 source sample X(N) and from negating circuitry 306E a signal representing the arithmetic negation of source sample X(N−5) and produces a signal representing the difference of source samples X(N) and X(N−5).

Interpolator 300 further includes multipliers 310A–L. Each of multipliers produces a signal which represents the arithmetic product of the signal produced by one of adders 308A–F and one of composite weights c00, c01, c02, c10, c11, c12, d00, d01, d02, d10, d11, and d12 as shown. For example, multiplier 310A receives from adder 308A a signal $$\begin{bmatrix} Y0 \\ Y1 \\ Y2 \\ Y3 \end{bmatrix} = \begin{bmatrix} 1 & 0 & 0 & 1 \\ 0 & 1 & 1 & 0 \\ 0 & 1 & -1 & 0 \\ 1 & 0 & 0 & -1 \end{bmatrix} \begin{bmatrix} c00 & c01 & c02 & 0 & 0 & 0 \\ c10 & c11 & c12 & 0 & 0 & 0 \\ 0 & 0 & 0 & d12 & d11 & d10 \\ 0 & 0 & 0 & d02 & d01 & d00 \end{bmatrix} \begin{bmatrix} X(N) + X(N-5) \\ X(N-1) + X(N-4) \\ X(N-2) + X(N-3) \\ X(N-2) - X(N-3) \\ X(N-1) - X(N-4) \\ X(N) - X(N-5) \end{bmatrix} \quad (10)$$

In equation (10), cij refers to a composite weight whose value is (H(i+4j)+H((3−i)+4j))/2 and dij refers to a composite weight whose value is (H(i+4j)−H((3−i)+4j))/2. For example, composite weight c12 has a value of (H9+H10)/2, and composite weight d12 has a value of (H9−H10)/2.

It should be noted that the efficiencies described herein based upon the symmetry of weights H0 and H23 and weights H3 and H20 with respect to source samples X(N) and X(N−5) can be achieved even if the remainder of weight filter H is not symmetrical. For example, the efficiencies described above can be achieved for any two symmetrical weights of weight filter H. Two weights, i.e., a first and a representing the sum of source samples X(N) and X(N−5) and produces a signal which represents the arithmetic product of that sum and the value of composite weight c00. Composite weight c00 is retrieved from memory 104 (FIG. 1) or from a register of processor 102. As shown in FIG. 3, the signal produced by adder 308A is used twice. Specifically, multiplier 310B also receives from adder 308A a signal representing the sum of source samples X(N) and X(N−5) and produces a signal which represents the arithmetic product of that sum and the value of composite weight c10. The values represented by the respective signals produced by multipliers 310A–L are shown in Table A below.

TABLE A

| Multiplier | Value Represented By Produced Signals | Source Signals From |
|---|---|---|
| 310A | [X(N) + X(N-5)] · c00 | Adder 308A |
| 310B | [X(N) + X(N-5)] · c10 | Adder 308A |
| 310C | [X(N-1) + X(N-4)] · c01 | Adder 308B |
| 310D | [X(N-1) + X(N-4)] · c11 | Adder 308B |
| 310E | [X(N-2) + X(N-3)] · c02 | Adder 308C |
| 310F | [X(N-2) + X(N-3)] · c12 | Adder 308C |
| 310G | [X(N-2) − X(N-3)] · d02 | Adder 308D |
| 310H | [X(N-2) − X(N-3)] · d12 | Adder 308D |
| 310I | [X(N-1) − X(N-4)] · d01 | Adder 308E |
| 310J | [X(N-1) − X(N-4)] · d11 | Adder 308E |
| 310K | [X(N) − X(N-5)] · d00 | Adder 308F |
| 310L | [X(N) − X(N-5)] · d10 | Adder 308F |

As shown in Table A and in FIG. 3, the signal produced by each of adders 308A–F is used twice. Therefore, the number of adders required to produce interpolated samples Y0–Y3 is reduced from that required to produce interpolated signals using conventional techniques. In addition, no multiplication operations other than those performed by multipliers 310A–L are required to produce interpolated samples Y0–3 as shown in FIG. 3. Therefore, the number of multiplication operations is reduced by one-half, i.e., from twenty-four to twelve. The present invention therefore represents a significant improvement over conventional interpolation techniques.

As shown in FIG. 3, interpolator 300 includes adders 312A and 312B which collectively produce a signal representing the arithmetic sum of the signals produced by multipliers 310A, 310C, and 310E. Interpolator 300 also includes adders 312G and 312H which collectively produce a signal representing the arithmetic sum of the signals produced by multipliers 310H, 310J, and 310L. Adder 316A of interpolator 300 produces a signal representing the arithmetic sum of the signals produced by adders 312A and 312B and adders 312G and 312H. The signal produced by adder 316A is therefore interpolated sample Y0 according to equation (10) above. Similarly, adder 316D of interpolator 300 produces a signal representing the arithmetic difference of the signals produced by adders 312A and 312B and adders 312G and 312H since adder 316D receives from negating circuitry 314B a signal representing the arithmetic negation of the signal produced by adders 312G and 312H. The signal produced by adder 316D is therefore interpolated sample Y3 according to equation (10) above.

Interpolator 300 further includes adders 312C and 312D which collectively produce a signal representing the arithmetic sum of the signals produced by multipliers 310B, 310D, and 310E. In addition, interpolator 300 includes adders 312E and 312F which collectively produce a signal representing the arithmetic sum of the signals produced by multipliers 310G, 310I, and 310K. Adder 316B of interpolator 300 produces a signal representing the arithmetic sum of the signals produced by adders 312C and 312D and adders 312E and 312F. The signal produced by adder 316B is therefore interpolated sample Y1 according to equation (10) above. Similarly, adder 316C of interpolator 300 produces a signal representing the arithmetic difference of the signals produced by adders 312C and 312D and adders 312E and 312F since adder 316C receives from negating circuitry 314A a signal representing the arithmetic negation of the signal produced by adders 312E and 312F. The signal produced by adder 316C is therefore interpolated sample Y2 according to equation (10) above.

In one embodiment, adders of interpolator 300, e.g., adders 308A–F, are computer instructions which, when executed by processor 102 (FIG. 1), perform addition operations in which operands are signals in the form of data stored in memory 104 of computer system 100. In this embodiment, multipliers of interpolator 300 (FIG. 3), e.g., multipliers 310A–L, are computer instructions which, when executed by processor 102 (FIG. 1), perform multiplication operations in which operands are signals in the form of data stored in memory 104 of computer system 100. In an alternative embodiment, adders and multipliers of interpolator 300 (FIG. 3) are voltage adders and voltage multipliers, respectively, and source samples, interpolated samples, and intermediate signals described above are voltages. In addition, interpolator 300 includes a number of instances of negation circuitry, e.g., negation circuitry 306E. In one embodiment, an adder, e.g, adder 308F, is capable of producing a signal which represents the arithmetic difference between respective values of two received signals. In such an embodiment, negation circuitry 3 such as negation circuitry 306E is obviated and adders which receive signals produced by negation circuitry are configured to produce signals which represent arithmetic differences of the respective values or received signals. For example, negation circuitry 306E is omitted and adder 308F is configured to produce a signal representing the arithmetic difference between the respective values represented by signals received from terminal 302 and delay unit 304E in such an embodiment. In such an embodiment, negation circuitry does not add to the complexity of an interpolator or decimator.

In the above illustrative example of the principles of the present invention, an even number of interpolated samples are derived from an even number of source samples. Further efficiencies can be realized when an odd number of interpolated samples are derived or when interpolated samples are derived from an odd number of source samples. It is helpful to consider the following example. Suppose that three interpolated samples Y0–Y2 are derived from five source samples X(N) through X(N-4) from source buffer 112 (FIG. 1). Equations which are analogous to equations (1) through (4) above can be written in matrix form as the following equation which describes the derivation of interpolated samples Y0–Y2.

$$\begin{bmatrix} Y0 \\ Y1 \\ Y2 \end{bmatrix} = \begin{bmatrix} H0 & H3 & H6 & H9 & H12 \\ H1 & H4 & H7 & H10 & H13 \\ H2 & H5 & H8 & H11 & H14 \end{bmatrix} \begin{bmatrix} X(N) \\ X(N-1) \\ X(N-2) \\ X(N-3) \\ X(N-4) \end{bmatrix} \quad (11)$$

If the weight filter matrix is centrosymmetric, i.e., if weights H0, H1, H2, H3, H4, H5, and H6 are equivalent to weights H14, H13, H12, H11, H10, H9, and H8, respectively, equation (11) is equivalent to the following equation (12).

$$\begin{bmatrix} Y0 \\ Y1 \\ Y2 \end{bmatrix} = \begin{bmatrix} H0 & H3 & H6 & H5 & H2 \\ H1 & H4 & H7 & H4 & H1 \\ H2 & H5 & H6 & H3 & H0 \end{bmatrix} \begin{bmatrix} X(N) \\ X(N-1) \\ X(N-2) \\ X(N-3) \\ X(N-4) \end{bmatrix} \quad (12)$$

Efficiencies are realized in the manner described above based upon symmetry of weights H0, H2, H3, H5, H9, H11, H12, and H14. Further efficiency is realized from the symmetry of weights H1, H4, H10, and H13.

Interpolated sample Y1 is derived by an interpolator in accordance with the value H1·X(N)+H4·X(N−1)+H7·X(N−2)+H4·X(N−3)+H1·X(N−4) of equation (12). Efficiency is derived from multiple occurrences of weights H1 and H4. Specifically, the value represented by interpolated sample is equivalent to H1·[X(N)+X(N−4)]+H4·[X(N−1)+X(N−3)]+H7·X(N−2). Accordingly, by summing the respective values represented by source samples X(N) and X(N−4) with the respective values represented by source samples X(N−1) and X(N−3) prior to weighting the respective sums by weights H1 and H4. Accordingly, derivation of interpolated sample Y1 requires only three (3) multipliers and three (3) adders rather than five (5) multipliers and four (4) adders in a conventional interpolator. In general, summing source samples prior to weighting the sums with common weights as described reduces a calculation which ordinarily involves a number, $n_m$, of multipliers and a number, $n_a = n_m − 1$, of adders, the number of multipliers required are reduced to $(n_m+1)/2$ and the number of adders remains $n_a = n_m − 1$. Interpolated sample Y1 which represents the value H1·[X(N)+X(N−4)]+H4·[X(N−1)+X(N−3)]+H7·X(N−2) is produced by a portion of an interpolator 400 (FIG. 4) which implements equation (12) in accordance the present invention.

Interpolator 400 is described more completely below. Interpolator 400 is described briefly here and includes adders 408A and 408B which produce respective signals representing the arithmetic sum of the values represented by source samples X(N) and X(N−4) and the arithmetic sum of the values represented by source samples X(N−1) and X(N−3), respectively. Interpolator 400 also includes multipliers 410A, 410C, and 410E. Multiplier 410A receives the signal produced by adder 408A and weight H1, which is stored in a register in processor 102 or in memory 104 for example, and produces a signal which represents the arithmetic product of the signal produced by adder 408A and weight H1. Similarly, multiplier 410C receives the signal produced by adder 408B and weight H4, which is also stored in a register in processor 102 or in memory 104 for example, and produces a signal which represents the arithmetic product of the signal produced by adder 408B and weight H4. Multiplier 410E receives source sample X(N−2) from delay unit 404B and weight H7, which is also stored in a register in processor 102 or in memory 104 for example, and produces a signal which represents the arithmetic product of source sample X(N−2) and weight H7. The signals produced by multipliers 410A, 410C, and 410E are then used to calculate interpolated samples Y0–Y2 in a manner described more completely below.

Further efficiency is realized from the symmetry of weights H6 and H8 and from the position of weights H6 and H8 in the same column of the weight filter matrix of equation (11), i.e., in that weights H6 and H8 are equivalent and applied to the same source sample in the derivation of separate interpolated samples. Specifically, from equation (12), components of the derivation of interpolated samples Y0 and Y2 both include H6·X(N−2). A signal representing the value H6·X(N−2) is produced once by a multiplier 410F and used in deriving both interpolated sample Y0 and interpolated sample Y2. The following equation, which is equivalent to equation (12) above, represents the efficiencies realized by interpolator 400 in accordance with the present invention.

$$\begin{bmatrix} Y0 \\ Y1 \\ Y2 \end{bmatrix} = \begin{bmatrix} 1 & 0 & 1 \\ 0 & 1 & 0 \\ 1 & 0 & -1 \end{bmatrix} \begin{bmatrix} c00 & c01 & H6 & 0 & 0 \\ H1 & H4 & H7 & 0 & 0 \\ 0 & 0 & 0 & d01 & d00 \end{bmatrix} \begin{bmatrix} X(N) + X(N-4) \\ X(N-1) + X(N-3) \\ X(N-2) \\ X(N-1) - X(N-3) \\ X(N) - X(N-4) \end{bmatrix} \quad (13)$$

Figure 4:
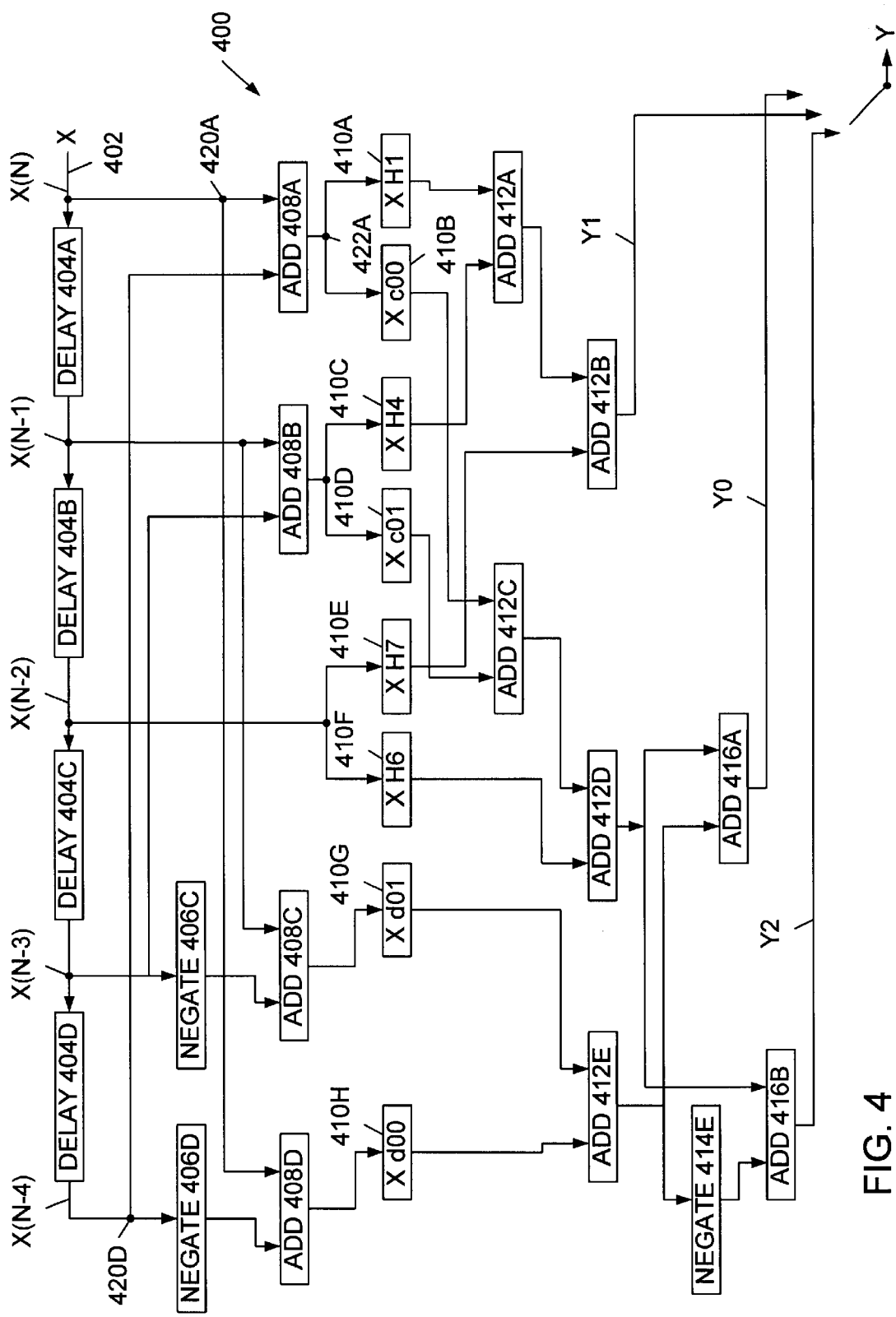
FIG. 4 is a block diagram of a 1-to-3 interpolator in accordance with the present invention.

In equation (13), (i) the value represented by composite weight c00 is equivalent to (H0+H2)/2, (ii) the value represented by composite weight c01 is equivalent to (H3+H5)/2, (iii) the value represented by composite weight d00 is equivalent to (H0−H2)/2, and (iv) the value represented by composite weight d01 is equivalent to (H3−H5)/2. Table B below shows the various connections and signals of interpolator 400 (FIG. 4).

TABLE B

| Component | Signals Received From | Value Represented by Output Signal |
|---|---|---|
| Terminal 402 | X | X(N) |
| Delay unit 404A | Terminal 402 | X(N-1) |
| Delay unit 404B | Delay unit 404A | X(N-2) |
| Delay unit 404C | Delay unit 404B | X(N-3) |
| Delay unit 404D | Delay unit 404C | X(N-4) |
| Negate 406C | Delay unit 404C | −X(N-3) |
| Negate 406D | Delay unit 404D | −X(N-4) |
| Adder 408A | Terminal 402, Delay unit 404D | X(N) + X(N-4) |
| Adder 408B | Delay unit 404A, Delay unit 404C | X(N-1) + X(N-2) |
| Adder 408C | Delay unit 404A, Negate 406C | X(N-1) − X(N-2) |
| Adder 408D | Terminal 402, Negate 406D | X(N) − X(N-4) |
| Multiplier 410A | H1, Adder 408A | H1 · [X(N) + X(N-4)] |
| Multiplier 410B | c00, Adder 408A | c00 · [X(N) + X(N-4)] |
| Terminal 402 | X | X(N) |
| Delay unit 404A | Terminal 402 | X(N-1) |
| Delay unit 404B | Delay unit 404A | X(N-2) |
| Delay unit 404C | Delay unit 404B | X(N-3) |
| Delay unit 404D | Delay unit 404C | X(N-4) |
| Negate 406C | Delay unit 404C | −X(N-3) |
| Negate 406D | Delay unit 404D | −X(N-4) |
| Adder 408A | Terminal 402, Delay unit 404D | X(N) + X(N-4) |
| Adder 408B | Delay unit 404A, Delay unit 404C | X(N-1) + X(N-3) |
| Adder 408C | Delay unit 404A, Negate 406C | X(N-1) − X(N-3) |
| Adder 408D | Terminal 402, Negate 406D | X(N) − X(N-4) |
| Mulipiler 410A | H1, Adder 408A | H1 · [X(N) + X(N-4)] |
| Mulipiler 410B | c00, Adder 408A | c00 · [X(N) + X(N-4)] |
| Mulipiler 410C | H4, Adder 408B | H4 · [X(N-1) + X(N-3)] |
| Mulipiler 410D | c01, Adder 408B | c01 · [X(N-1) + X(N-3)] |
| Mulipiler 410E | H7, Delay unit 404B | H7 · X(N-2) |
| Mulipiler 410F | H6, Delay unit 404B | H6 · X(N-2) |
| Mulipiler 410G | d01, Adder 408C | d01 · [X(N-1) − X(N-3)] |
| Mulipiler 410H | d00, Adder 408D | d00 · [X(N) − X(N-4)] |
| Adder 412A | Mulipiler 410A, Mulipiler 410C | H1 · [X(N) + X(N-4)] + H4 · [X(N-1) + X(N-3)] |
| Adder 412B | Adder 412A, Mulipiler 410E | H1 · [X(N) + X(N-4)] + H4 · [X(N-1) + X(N-3)] + H7 · X(N-2) = Y1 |

TABLE B-continued

| Component | Signals Received From | Value Represented by Output Signal |
|---|---|---|
| Adder 412C | Muliplier 410B, Muliplier 410D | c00 · [X(N) + X(N-4)] + c01 · [X(N-1) + X(N-3)] |
| Adder 412D | Adder 412C, Muliplier 410F | c00 · [X(N) + X(N-4)] + c01 · [X(N-1) + X(N-3)] + H6 · X(N-2) |
| Adder 412E | Muliplier 410G, Muliplier 410H | d01 · [X(N-1) − X(N-3)] + d00 · [X(N) − X(N-4)] |
| Negate 414E | Adder 412E | −d01 · [X(N-1) − X(N-3)] + d00 · [X(N) − X(N-4)] |
| Adder 416A | Adder 412D, Adder 412E | c00 · [X(N) + X(N-4)] + c01 · [X(N-1) + X(N-3)] + H6 · X(N-2) + d01 · [X(N-1) − X(N-3)] + d00 · [X(N) − X(N-4)] = Y0 |
| Adder 416B | Adder 412D, Adder 412E | c00 · [X(N) + X(N-4)] + c01 · [X(N-1) + X(N-3)] + H6 · X(N-2) − d01 · [X(N-1) − X(N-3)] − d00 · [X(N) − X(N-4)] = Y2 |
| Multiplier 410C | H4, Adder 408B | H4 · [X(N-1) + X(N-2)] |
| Multiplier 410D | c01, Adder 408B | c01 · [X(N-1) + X(N-2)] |
| Multiplier 410E | H7, Delay unit 404B | H7 · X(N-2) |
| Multiplier 410F | H6, Delay unit 404B | H6 · X(N-2) |
| Multiplier 410G | d01, Adder 408C | d01 · [X(N-1) − X(N-2)] |
| Multiplier 410H | d00, Adder 408D | d00 · [X(N) − X(N-4)] |
| Adder 412A | Multiplier 410A, Multiplier 410C | H1 · [X(N) + X(N-4)] + H4 · [X(N-1) + X(N-2)] |
| Adder 412B | Adder 412A, Multiplier 410E | H1 · [X(N) + X(N-4)] + H4 · [X(N-1) + X(N-2)] + H7 · X(N-2) = Y1 |
| Adder 412C | Multiplier 410B, Multiplier 410D | c00 · [X(N) + X(N-4)] + c01 · [X(N-1) + X(N-2)] |
| Adder 412D | Adder 412C, Multiplier 410F | c00 · [X(N) + X(N-4)] + c01 · [X(n-1) + X(N-2)] + H6 · X(N-2) |
| Adder 412E | Multiplier 410G, Multiplier 410H | d01 · [X(N-1) − X(N-2)] + d00 · [X(N) − X(N-4)] |
| Negate 414E | Adder 412E | −d01 · [X(N-1) − X(N-2)] + d00 · [X(N) − X(N-4)] |
| Adder 416A | Adder 412D, Adder 412E | c00· [X(N) + X(N-4)] + c01 · [X(N-1) + X(N-2)] + H6 · X(N-2) + d01 · [X(N-1) − X(N-2)] + d00 · [X(N) − X(N-4)] = Y0 |
| Adder 416B | Adder 412D, Negate 414E | c00 · [X(N) + X(N-4)] + c01 · [X(N-1) + X(N-2)] + H6 · X(N-2) − d01 · [X(N-1) − X(N-2)] − d00 · [X(N) − X(N-4)] = Y2 |

Interpolator 400 FIG. 4) therefore uses eight (8) multipliers to produce interpolated samples Y0–Y2 whereas producing interpolated samples Y0–Y2 according to equation (11) above using conventional techniques requires fifteen (15) multipliers. In addition, interpolator 400 uses eleven (11) adders to produce interpolated samples Y0–Y2 whereas producing interpolated samples Y0–Y2 according to equation (11) above using conventional techniques requires twelve (12) adders.

Decimators

It is commonly known in digital network theory that an N-to-one decimator is the transpose of a one-to-N interpolator. Such is described, for example, in C. R. Crochiere and L. R. Rabiner, *Multirate Digital Signal Processing*, (Prentice Hall, Englewood Cliffs, N.J.) (1983). Accordingly, to design a particularly efficient N-to-one decimator according to the present invention, a particularly efficient one-to-N interpolator is designed in accordance with the principles of the present invention and the transpose of the one-to-N interpolator is determined.

Figure 5:
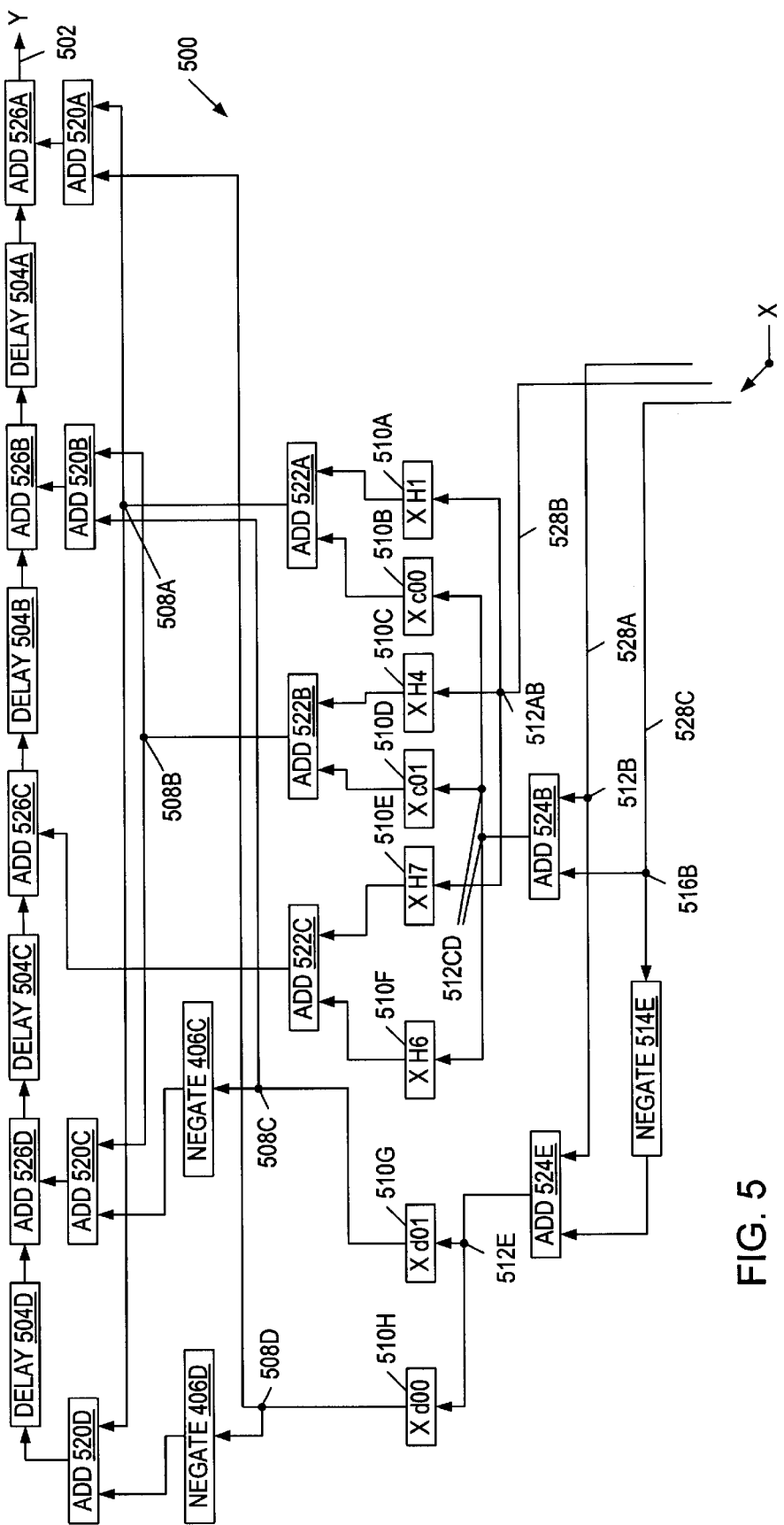
FIG. 5 is a block diagram of a 3-to-1 decimator in accordance with the present invention.

For example, interpolator 400 (FIG. 4) is a one-to-three interpolator in which weight filter H has a length of fifteen (15), i.e., includes fifteen (15) weights, and is centrosymmetric. A three-to-one decimator in which weight filter H has a length of fifteen (15) and is centrosymmetric is shown as decimator 500 (FIG. 5). The design of decimator 500 is related to interpolator 400 (FIG. 4) as follows.

Each branch node of interpolator 400 in which a signal is duplicated and applied as an input signal to two components, such as adders or multipliers, is replaced with an adder whose input signals are supplied by the two components after transposition and whose output signal is the driver of the signal which is duplicated in the interpolator. For example, branch node 420D (FIG. 4) of interpolator 400 duplicates the signal driven by delay unit 404D and applies the duplicated signal to negation circuitry 406D and to adder 408A. Transposition of branch node 420D results in adder 520D (FIG. 5) whose output signal is applied to delay unit 504D and whose input signals are driven by negation circuitry 506D and adder 522A through branch 508A. Delay unit 504D and negation circuitry 506D correspond to delay unit 404D (FIG. 4) and negation circuitry 406D, respectively. As described below, branch node 508A (FIG. 5) is the result of transposition of adder 408A (FIG. 4).

Each adder of interpolator 400 is replaced with a branch node in decimator 500 (FIG. 5) (i) whose input signal is driven by a component corresponding to components of interpolator 400 (FIG. 4) which receives the output signal of the adder and (ii) whose output signals are applied to components corresponding to components of interpolator 400 which supply the input signals of the adder. For example, the result of transposition of adder 408A is branch node 508A (FIG. 5). Adder 408A (FIG. 4) has input signals which are received from branch nodes 420A and 420D and an output signal which is supplied to branch node 422A. The results of transposition of branch nodes 420A, 420D, and 422A are adders 520A (FIG. 5), 520D, and 522A, respectively. Accordingly, the result of transposition of adder 408A (FIG. 4) is branch node 508A (FIG. 5) whose input signal is received from adder 522A and whose output signals are applied to adders 520A and 520D.

Each of the remaining components of interpolator 400 (FIG. 4) are transposed by swapping input signals and output signals. For example, multiplier 410H receives as an input signals the signal driven by adder 408D and multiplies the signal by composite weight d00 and supplies the resulting signal to adder 412E. The result of transposing multiplier 410H is multiplier 510H (FIG. 5) of decimator 500. Multiplier 510H (i) receives a signal from branch node 512E, which is the result of transposition of adder 412E (FIG. 4), (ii) multiplies the received signal by composite weight d00 (FIG. 5), and (iii) supplies the resulting signal to branch node 508D, which is the result of transposition of adder 408D (FIG. 4).

The production of decimated sample components Y(N), Y(N−1), Y(N−2), Y(N−3), and Y(N−4) from source samples X0, X1, and X2 by decimator 500 (FIG. 5) is represented by the following equation (14).

$$\begin{bmatrix} Y(N) \\ Y(N-1) \\ Y(N-2) \\ Y(N-3) \\ Y(N-4) \end{bmatrix} = \begin{bmatrix} 1 & 0 & 0 & 0 & 1 \\ 0 & 1 & 0 & 1 & 0 \\ 0 & 0 & 1 & 0 & 0 \\ 0 & 1 & 0 & -1 & 0 \\ 1 & 0 & 0 & 0 & -1 \end{bmatrix} \begin{bmatrix} c00 & H1 & 0 \\ c01 & H4 & 0 \\ H6 & H7 & 0 \\ 0 & 0 & d01 \\ 0 & 0 & d00 \end{bmatrix} \begin{bmatrix} X0+X2 \\ X1 \\ X0-X2 \end{bmatrix} \quad (14)$$

Decimator 500 (FIG. 5) is the result of transposition of interpolator 400 (FIG. 4). The efficiencies realized in interpolator 400 as described above are similarly realized in decimator 500 (FIG. 5). Analogously, any of the efficiencies described herein with respect to an interpolator can also be realized in a decimator which is related to an interpolator which is designed in accordance with the principles of the present invention. For example, composite weights c00 and c01 are applied to signals representing the sum of the values represented by source samples X0 and X2 and composite weights d00 and d01 are applied to signals representing the difference of the values represented by source samples X0 and X2 in a directly analogous manner to that described above with respect to interpolator 300 (FIG. 3). In addition, weights H1 and H4 are applied to source sample X1 once each and used twice each in the production of decimated sample components Y(N), Y(N−1), Y(N3), and Y(N−4) in a directly analogous manner to that described above with respect to interpolator 400 (FIG. 4). Also in a directly analogous manner to that described above with respect to interpolator 400, weight H6 is applied to a signal representing the sum of the values represented by source samples X0 and X2 within decimator 500 (FIG. 5).

Processing Complexity

A useful measurement of the efficiency of an interpolator or decimator is the processing complexity. With respect to an interpolator, processing complexity represents a number of processing components, e.g., multipliers and adders, for each input. For example, the processing complexity of interpolator 400 (FIG. 4) represents the number of processing components required to produce interpolated samples Y0, Y1, and Y2 before source samples X(N) through X(N−4) are shifted through delay units 404A–D to read another source sample at terminal 402. With respect to a decimator, processing complexity represents a number of processing components for each output. For example, the processing complexity of decimator 500 (FIG. 5) represents the number of processing components required to produce a decimated sample at terminal 502 from three source samples received at terminals 528A–C.

Table C below shows the processing complexity of a one-to-N interpolator designed in accordance with the principles of the present invention and which involves a weight filter H which has a number, L, of weights and which is centrosymmetric. In Table C below, M=L/N and N, L, and M are integers.

TABLE C

| M | N | Multipliers | Adders | Delay units |
|---|---|---|---|---|
| even | even | L/2 | L/2 + M | M − 1 |
| even | odd | L/2 | L/2 + M − 1 | M − 1 |
| odd | even | L/2 | L/2 + M − 1 | M − 1 |
| odd | odd | (L + 1)/2 | (L + 1)/2 + M − 2 | M − 1 |

By comparison, generating interpolated signals Y0–Y2 according to equation (11) above requires generally L multipliers and L–N adders.

Table D below shows the processing complexity of an N-to-one decimator designed in accordance with the principles of the present invention and which involves a weight filter H which has a number, L, of weights and which is centrosymmetric. In Table D below, M=L/N and N, L, and M are integers.

TABLE D

| M | N | Multipliers | Adders | Delay units |
|---|---|---|---|---|
| even | even | L/2 | L/2 + M + N − 1 | M − 1 |
| even | odd | L/2 | L/2 + M + N − 2 | M − 1 |
| odd | even | L/2 | L/2 + M + N − 2 | M − 1 |
| odd | odd | (L + 1)/2 | (L + 1)/2 + M + N − 3 | M − 1 |

By comparison, a decimator which is the transpose of a conventional interpolator designed according to equation (11) above generally L multipliers and L−1 adders.

Further Improvement in Additive Complexity

Additive complexity, i.e., the number of adders of an interpolator or decimator in accordance with the present invention, can be further reduced in some circumstances. The following is an illustrative example.

The following equation represents the interpolation of two interpolated samples using a weight filter H whose length is twenty-four (24).

$$\begin{bmatrix} Y0 \\ Y1 \end{bmatrix} = \begin{bmatrix} H0 & H2 & H4 & H6 & H8 & H10 & H12 & H14 & H16 & H18 & H20 & H22 \\ H1 & H3 & H5 & H7 & H9 & H11 & H13 & H15 & H17 & H19 & H21 & H23 \end{bmatrix} \begin{bmatrix} X(N) \\ X(N-1) \\ X(N-2) \\ X(N-3) \\ X(N-4) \\ X(N-5) \\ X(N-6) \\ X(N-7) \\ X(N-8) \\ X(N-9) \\ X(N-10) \\ X(N-11) \end{bmatrix} \quad (15)$$

The additive complexity of an interpolator designed according to equation (15) is twenty-four (24) as can be seen in Table C above. In other words, for each interpolation to produce two interpolated samples Y0 and Y1, twenty-four adders are required.

The weight matrix of equation (15) has twelve columns and two rows. By recognizing that source sample X(N−1) is source sample X(N) after one time delay unit in the sampling rate of source buffer 112 FIG. 1), equation (15) can be rewritten as the following equation (16).

$$\begin{bmatrix} Y0 \\ Y1 \end{bmatrix} = \begin{bmatrix} 1 & z_1^{-1} & 0 & 0 \\ 0 & 0 & 1 & z_1^{-1} \end{bmatrix} \begin{bmatrix} H0 & H4 & H8 & H12 & H16 & H20 \\ H2 & H6 & H10 & H14 & H18 & H22 \\ H1 & H5 & H9 & H13 & H17 & H21 \\ H3 & H7 & H11 & H15 & H19 & H23 \end{bmatrix} \begin{bmatrix} X(N) \\ X(N-2) \\ X(N-4) \\ X(N-6) \\ X(N-8) \\ X(N-10) \end{bmatrix} \quad (16)$$

In equation (16), $z_1^{-1}$ represents a single time delay in the sampling rate of source buffer 112. In other words, interpolated sample Y0 is produced by (i) weighting each of source samples X(N), X(N−2), X(N−4), X(N−6), X(N−8), and X(N−10) with a respective weight of the first row of the weight matrix of equation (16), (ii) weighting each of the same source samples with a respective weight of the second row of the weight matrix of equation (16) after a single delay, and (iii) combining the source samples as weighted to produce interpolated sample Y0.

Figure 6:
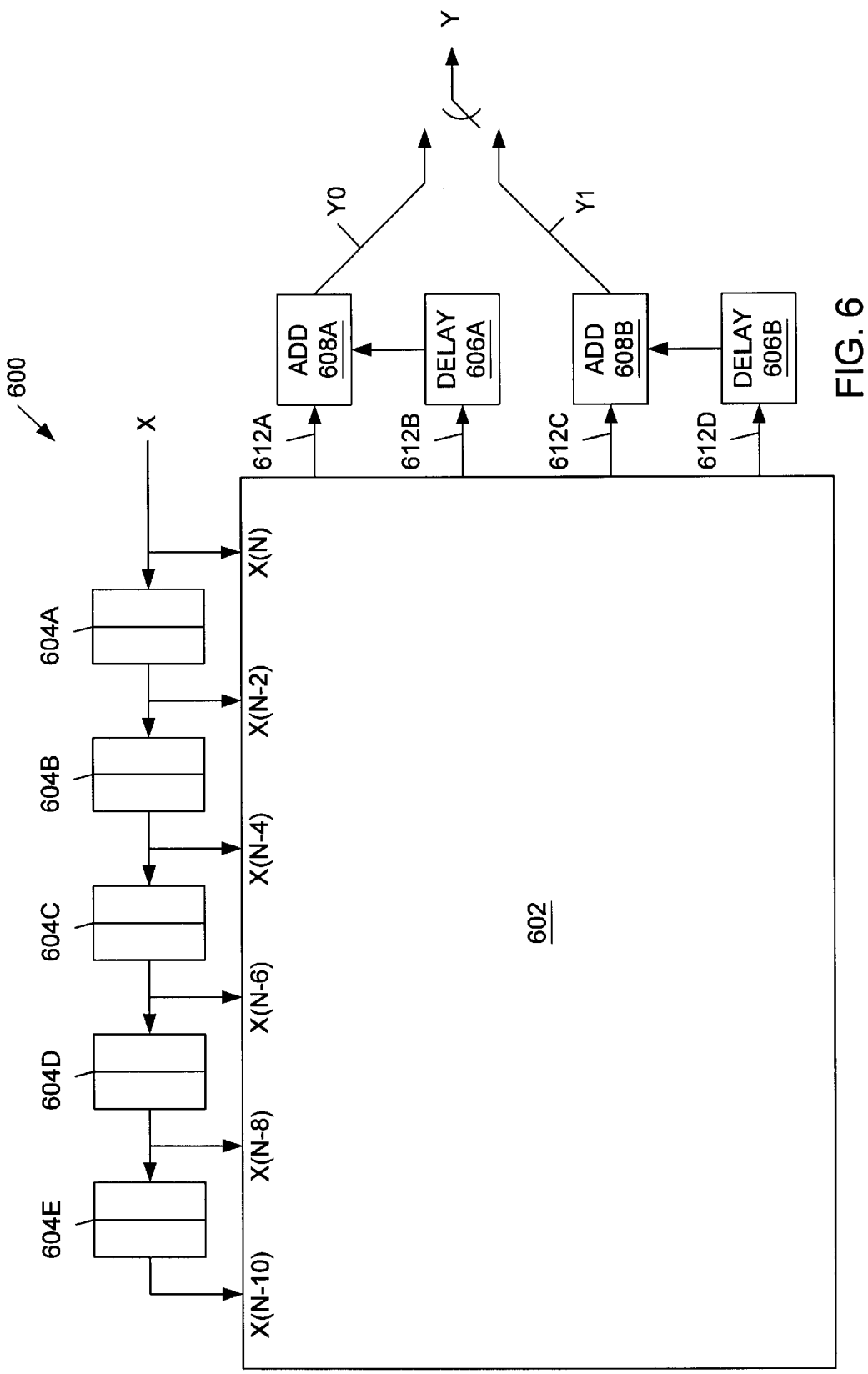
FIG. 6 is a block diagram of a 1-to-2 interpolator in accordance with the present invention in which additive complexity is reduced.

Interpolator 600 (FIG. 6) realizes the interpolation of equation (16). Interpolator 600 includes circuitry 602 which implements a one-to-four interpolator which is generally analogous to interpolator 300 (FIG. 3) as described above. Interpolator 600 (FIG. 6) includes delay units 604A–E each of which delays the source signal received at terminal 610 by an amount equal to twice the sampling interval of source buffer 112 (FIG. 1). Therefore, whereas interpolator 300 (FIG. 3) processes source samples X(N), X(N−1), X(N−2), X(N−3), X(N−4), and X(N−5), interpolator 600 (FIG. 6) processes source samples X(N), X(N−2), X(N−4), X(N−6), X(N−8), and X(N−10).

In a manner analogous to that described above with respect to interpolator 300 (FIG. 3), circuitry 602 (FIG. 6) of interpolator 600 produces four output signals on each of terminals 612A–D and each of which corresponds to a respective row of the weight matrix of equation (16). To produce interpolated sample Y0 in the manner described above, the produced signal on terminal 612B is delayed by delay unit 606A for an amount of time equal to a single sampling interval of source buffer 112 (FIG. 1). The delayed signal is added to the signal produced on terminal 612A by adder 608A. The resulting signal is interpolated sample Y0. Interpolator 600 produces interpolated sample Y1 is a directly analogous manner using terminals 612C–D, delay unit 608B, and adder 608B.

The additive complexity of interpolator 600 is twenty (20): eighteen (18), which is the additive complexity of circuitry 602 according to Table C above, plus two (2), as a result of adders 608A–B. Thus, four (4) fewer adders a required by interpolator 600 than to implement an interpolator according to equation (15) above. Within circuitry 602, six (6) adders are used to produce intermediate signals representing the following values: X(N)+X(N−10), X(N−2)+X(N−8), X(N−4)+X(N−6), X(N)−X(N−10), X(N−2)−X(N−8), and X(N−4)−X(N−6) in the production of the signal on terminal 612A in a manner analogous to that described above with respect to adders 308A–F (FIG. 3) of interpolator 300. The same six (6) adders are used to produce the same intermediate signals after a time delay for an amount of time equal to a single sampling interval of source buffer 112 (FIG. 1) in the production of the signal on terminal 612B. An interpolator implementing equation (15) in a straightforward manner would require twelve (12) such adders to produce intermediate signals X(N)+X(N−11), X(N−1)+X(N−10), X(N−2)+X(N−9), X(N−3)+X(N−8), X(N−4)+X(N−7), X(N−5)+X(N−6), X(N)−X(N−11), X(N−1)−X(N−10), X(N−2)−X(N−9), X(N−3)−X(N−8), X(N−4)−X(N−7), and X(N−5)−X(N−6).

Weight Filters of Arbitrary Length

In the illustrative examples described above, the number of weights of the weight filter H is an integer multiple of the number of interpolated samples in the context of interpolators or an integer multiple of the number of source samples in the context of decimators. However, the principles of the present invention are equally applicable to interpolators and decimators in which the number of weights of the weight filter H is not an integer multiple of the number of interpolated samples of an interpolator or an integer multiple of the number of source samples of a decimator. The following example is illustrative.

The following equation (17) corresponds to interpolation of seven (7) interpolated samples using a weight filter which includes thirty-three (33) weights.

$$\begin{bmatrix} Y0 \\ Y1 \\ Y2 \\ Y3 \\ Y4 \\ Y5 \\ Y6 \end{bmatrix} = \begin{bmatrix} H0 & H7 & H14 & H21 & H28 \\ H1 & H8 & H15 & H22 & H29 \\ H2 & H9 & H16 & H23 & H30 \\ H3 & H10 & H17 & H24 & H31 \\ H4 & H11 & H18 & H25 & H32 \\ H5 & H12 & H19 & H26 & 0 \\ H6 & H13 & H20 & H27 & 0 \end{bmatrix} \begin{bmatrix} X(N) \\ X(N-1) \\ X(N-2) \\ X(N-3) \\ X(N-4) \end{bmatrix} \quad (17)$$

In this illustrative example, weights H0–H32 are centrosymmetric. Accordingly, equation (17) is equivalent to the following equation (18).

$$\begin{bmatrix} Y0 \\ Y1 \\ Y2 \\ Y3 \\ Y4 \\ Y5 \\ Y6 \end{bmatrix} = \begin{bmatrix} H0 & H7 & H14 & H11 & H4 \\ H1 & H8 & H15 & H10 & H3 \\ H2 & H9 & H16 & H9 & H2 \\ H3 & H10 & H15 & H8 & H1 \\ H4 & H11 & H14 & H7 & H0 \\ H5 & H12 & H13 & H6 & 0 \\ H6 & H13 & H12 & H5 & 0 \end{bmatrix} \begin{bmatrix} X(N) \\ X(N-1) \\ X(N-2) \\ X(N-3) \\ X(N-4) \end{bmatrix} \quad (18)$$

Equation (18) can be divided into the following two separate equations (19) and (20).

$$\begin{bmatrix} Y0 \\ Y1 \\ Y2 \\ Y3 \\ Y4 \end{bmatrix} = \begin{bmatrix} H0 & H7 & H14 & H11 & H4 \\ H1 & H8 & H15 & H10 & H3 \\ H2 & H9 & H16 & H9 & H2 \\ H3 & H10 & H15 & H8 & H1 \\ H4 & H11 & H14 & H7 & H0 \end{bmatrix} \begin{bmatrix} X(N) \\ X(N-1) \\ X(N-2) \\ X(N-3) \\ X(N-4) \end{bmatrix} \quad (19)$$

$$\begin{bmatrix} Y5 \\ Y6 \end{bmatrix} = \begin{bmatrix} H5 & H12 & H13 & H6 \\ H6 & H13 & H12 & H5 \end{bmatrix} \begin{bmatrix} X(N) \\ X(N-1) \\ X(N-2) \\ X(N-3) \end{bmatrix} \quad (20)$$

The weights of the weight filter matrices of equations (19) and (20) are centrosymmetric and can therefore each be independently implemented in the manner described above to achieve the efficiencies described above with respect to interpolators 300 (FIG. 3) and 400 (FIG. 4) for example.

Figure 7:
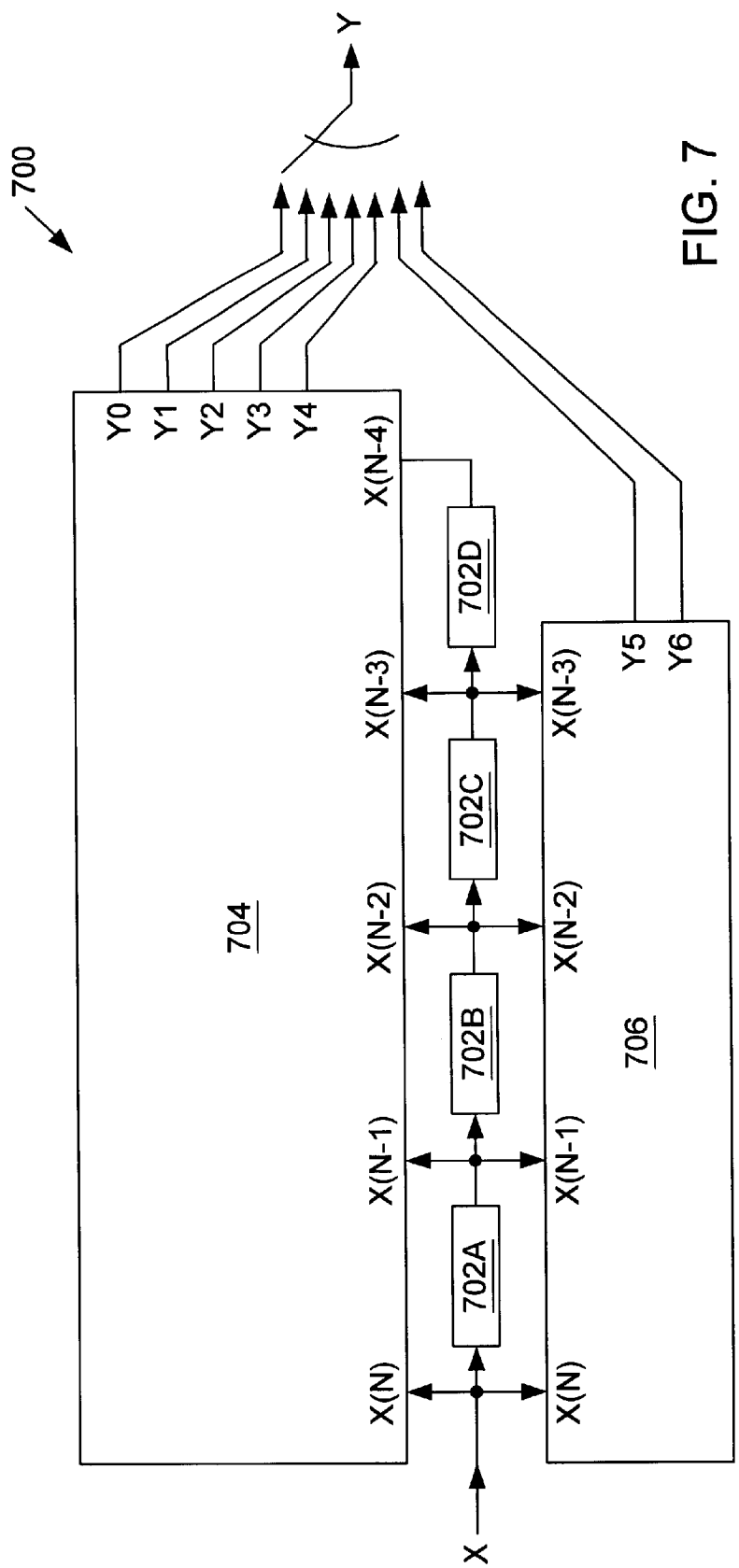
FIG. 7 is a block diagram of a 1-to-5 interpolator in accordance with the present invention in which the weight filter is divided into two sub-filters.

Interpolator 700 (FIG. 7) interpolates seven (7) interpolated samples using thirty-three (33) weights in accordance with equations (17)–(20). Interpolator 700 includes delay units 702A–D to form source samples X(N), X(N–1), X(N–2), X(N–3), and X(N–4) from source sample buffer 112 (FIG. 1) in the manner described above. Source samples X(N), X(N–1), X(N–2), X(N–3), and X(N–4) are applied to circuitry 704 which produces interpolated samples Y0, Y1, Y2, Y3, and Y4 in accordance with equation (19) in a manner which is analogous to that described above with respect to interpolators 300 (FIG. 3) and 400 (FIG. 4). Source samples X(N), X(N–1), X(N–2), and X(N–3) are applied to circuitry 706 which produces interpolated samples Y5 and Y6 in accordance with equation (20) in a manner which is analogous to that described above with respect to interpolators 300 (FIG. 3) and 400 (FIG. 4).

Thus, efficiencies described above in interpolators and decimators which involve a number of weights which is an integer multiple of the number of output sample per interpolation or input samples per decimation can be realized interpolators and decimators in which the number of weights is not an integer multiple of the number of output sample per interpolation or input samples per decimation.

Reducing Additive Complexity in Conjunction with Weight Filters of Arbitrary Length Interpolator 700 (FIG. 7) represents a substantial improvement in efficiency over conventional interpolators. It is appreciated, however, that circuitry 704 and circuitry 706 share input signals, e.g., source samples X(N), X(N–1), X(N–2), and X(N–3), but share no signals subsequently derived from the input signals. Since source samples X(N) and X(N–2) are equivalent to source samples X(N–1) and X(N–3), respectively, after one time delay in the sampling rate of source buffer 112 (FIG. 1), equation (18) above is equivalent to equation (21) below, in which $z_1^{-1}$ represents a single time delay in the sampling rate of source buffer 112.

$$\begin{bmatrix} Y0 \\ Y1 \\ Y2 \\ Y3 \\ Y4 \\ Y5 \\ Y6 \end{bmatrix} = \begin{bmatrix} 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ z_1^{-1} & 0 & 0 & 0 & 0 & 0 & 1 & 0 \\ 0 & z_1^{-1} & 0 & 0 & 0 & 0 & 0 & 1 \end{bmatrix} \begin{bmatrix} 0 & H5 & 0 & H13 & 0 \\ 0 & H6 & 0 & H12 & 0 \\ H0 & H7 & H14 & H11 & H4 \\ H1 & H8 & H15 & H10 & H3 \\ H2 & H9 & H16 & H9 & H2 \\ H3 & H10 & H15 & H8 & H1 \\ H4 & H11 & H14 & H7 & H0 \\ 0 & H12 & 0 & H6 & 0 \\ 0 & H13 & 0 & H5 & 0 \end{bmatrix} \begin{bmatrix} X(N) \\ X(N-1) \\ X(N-2) \\ X(N-3) \\ X(N-4) \end{bmatrix} \quad (21)$$

Derivation of interpolated samples Y0–Y4 includes intermediate signals corresponding to values X(N−1)+X(N−3) and X(N−1)−X(N−3) for generally the reasons described above with respect to equations (9) and (10). According to equation (21), the same intermediate signals are used to derive interpolated signals Y5 and Y6. Specifically, weights H5 and H6 which are applied to source samples X(N) and X(N−3) according to equations (18) and (20) are applied to source samples X(N−1) and X(N−3) in equation (21). In addition, weights H12 and H13 which are applied to source samples X(N−1) and X(N−2) according to equations (18) and (20) are applied to source samples X(N−1) and X(N−3) in equation (21). As a result, weights H5, H6, H12, and H13 are applied to source samples X(N−1) and X(N−3) in equation (21) as are weights H7–H11. Accordingly, symmetry in the remainder the matrix representation of weight filter H is further exploited by aligning the symmetrical application of weights H5, H6, H12, and H13 with the symmetrical application of weights H7–H11 of weight filter H.

Equation (21) is equivalent to equation (22) below in which interpolated signals Y5' and Y6' are equivalent to interpolated signals Y5 and Y6, respectively, corresponding to a set of source samples X(N), X(N−1), X(N−2), X(N−3), and X(N−4) before one time delay in the sampling rate of source buffer 112 (FIG. 1).

$$\begin{bmatrix} Y5' \\ Y6' \\ Y0 \\ Y1 \\ Y2 \\ Y3 \\ Y4 \end{bmatrix} = \begin{bmatrix} 1 & 0 & 0 & 0 & 0 & 0 & 0 & z_1^{-1} & 0 \\ 0 & 1 & 0 & 0 & 0 & 0 & 0 & 0 & z_1^{-1} \\ 0 & 0 & 1 & 0 & 0 & 0 & 0 & 0 & 0 \\ 0 & 0 & 0 & 1 & 0 & 0 & 0 & 0 & 0 \\ 0 & 0 & 0 & 0 & 1 & 0 & 0 & 0 & 0 \\ 0 & 0 & 0 & 0 & 0 & 1 & 0 & 0 & 0 \\ 0 & 0 & 0 & 0 & 0 & 0 & 1 & 0 & 0 \end{bmatrix} \begin{bmatrix} 0 & H5 & 0 & H13 & 0 \\ 0 & H6 & 0 & H12 & 0 \\ H0 & H7 & H14 & H11 & H4 \\ H1 & H8 & H15 & H10 & H3 \\ H2 & H9 & H16 & H9 & H2 \\ H3 & H10 & H15 & H8 & H1 \\ H4 & H11 & H14 & H7 & H0 \\ 0 & H12 & 0 & H6 & 0 \\ 0 & H13 & 0 & H5 & 0 \end{bmatrix} \begin{bmatrix} X(N) \\ X(N-1) \\ X(N-2) \\ X(N-3) \\ X(N-4) \end{bmatrix} \quad (22)$$

Interpolator 800 (FIG. 8) implements the derivation of interpolated signals Y5', Y6', Y0, Y1, Y2, Y3, and Y4 according to equation (22). Interpolator 800 includes delay units 802A–D which are directly analogous to delay units 702A–D (FIG. 7) and which separate source signals X), X(N−1), X(N−2), X(N−3), and X(N−4) (FIG. 8) in a directly analogous manner to that described above with respect to delay units 302A–E (FIG. 3). Interpolator 800 (FIG. 8) includes circuitry 804 which is directly analogous to circuitry 704 (FIG. 7) and which produces interpolated samples Y0, Y1, Y2, Y3, and Y4 (FIG. 8) in accordance with equation (19) in a analogous manner to that described above with respect to interpolators 300 (FIG. 3) and 400 (FIG. 4).

Intermediate signals X(N−1)+X(N−3) and X(N−1)−X(N−3) of circuitry 804 are used to derive interpolated signals Y5' and Y6' according to equation (22) above. Table E below shows the various connections and signals of interpolator 800 (FIG. 8) which operate to derive interpolated signals Y5' and Y6'. In interpolator 800, and therefore Table E below, composite weight a00 is equivalent to (H5+H13)/2, composite weight a10 is equivalent to (H6+H12)/2, composite weight b00 is equivalent to (H5−H13)/2, and composite weight b10 is equivalent to (H6−H12)/2.

TABLE E

| Component | Signals Received From | Value Represented by Output Signal |
|---|---|---|
| Multiplier 806A | a10, Circuitry 804 | a10 · [X(N-1) + X(N-3)] |
| Multiplier 806B | a00, Circuitry 804 | a00 · [X(N-1) + X(N-3)] |
| Multiplier 806C | b10, Circuitry 804 | b10 · [X(N-1) − X(N-3)] |
| Multiplier 806D | b00, Circuitry 804 | b00 · [X(N-1) − X(N-3)] |
| Negate 808C | Multiplier 806C | −b10 · [X(N-1) − X(N-3)] |
| Negate 808D | Multiplier 806D | −b00 · [X(N-1) − X(N-3)] |
| Adder 810A | Multiplier 806A, Multiplier 806C | a10 · [X(N-1) + X(N-3)] +b10 · [X(N-1) − X(N-3)] |
| Adder 810B | Multiplier 806B, Multiplier 806D | a00 · [X(N-1) + X(N-3)] +b00 · [X(N-1) − X(N-3)] |
| Adder 810C | Multiplier 806A, Negate 808C | a10 · [X(N-1) + X(N-3)] −b10 · [X(N-1) − X(N-3)] |
| Adder 810D | Multiplier 806B, Negate 808D | a00 · [X(N-1) + X(N-3)] +b00 · [X(N-1) − X(N-3)] |
| Delay unit 812C | Adder 810C | $z_1^{-1}$ · [a10 · [X(N-1) + X(N-3)] −b10 · [X(N-1) − X(N-3)]] |
| Delay unit 812D | Adder 810D | $z_1^{-1}$ · [a00 · [X(N-1) + X(N-3)] + b00 · [X(N-1) − X(N-3)]] |

TABLE E-continued

| Component | Signals Received From | Value Represented by Output Signal |
|---|---|---|
| Adder 814A | Adder 810A, Delay unit 812C | a10 · [X(N-1) + X(N-3)] +b10 · [X(N-1) − X(N-3)] +$z_1^{-1}$ · [a10 · X(N-1) + X(N-3)] −b10 · [X(N-1) − X(N − 3)]] = Y6' |
| Adder 814B | Adder 810B, Delay unit 812D | a00 · [X(N-1) + X(N-3)] +b00 · [X(N-1) − X(N-3)] +$z_1^{-1}$ · [a00 · [X(N-1) + X(N-3)] +b00 · [X(N-1) − X(N-3)]] = Y5' |

In producing interpolated signals Y5' and Y6', interpolator 800 (FIG. 8) includes four (4) multipliers and six (6) adders. By comparison, circuitry 706 (FIG. 7) of interpolator 700 includes four (4) multipliers and nine (9) adders to produce interpolated signals Y5 and Y6 as shown in Table D. Accordingly, interpolator 800 (FIG. 8) produces interpolated signals Y5 and Y6 with three (3) fewer adders by constructing interpolator 800 according to equation (22) in which symmetrical application of weights H5, H6, H12, and H13 is aligned with symmetrical application of weights H7–H11 such that each of weights H5–H13 is applied to both source samples X(N−1) and X(N−3).

The additive complexity of interpolators in which a weight function H has an arbitrary length is shown below in Table F. In Table F, weight function H has a length L which is equal to MN+K where N is the number of interpolated signals produced by the interpolator, and W equals M plus the integer portion of (L+1)/2. L, M, N, K, and W are integers. Approach A refers to the general approach described above with respect to interpolator 700 (FIG. 7) and equations (18) through (20), and Approach B refers to the general approach described above with respect to interpolator 800 (FIG. 8) and equations (21) and (22).

TABLE F

Additive Complexity

| M | N | K | Approach A | Approach B |
|---|---|---|---|---|
| even | even | even | W + M | W + N − K |
| even | even | odd | W + M − 2 | W + N − K − 1 |
| even | odd | even | W + M − 1 | W + N − K |
| even | odd | odd | W + M − 1 | W + N − K − 1 |
| odd | even | even | W + M | W + K − 1 |
| odd | even | odd | W + M − 2 | W + K − 2 |
| odd | odd | even | W + M − 1 | W + K − 2 |
| odd | odd | odd | W + M − 1 | W + K − 1 |

In general, Approach A and Approach B require the same number of multipliers, but Approach B requires additional delay units. Specifically, Approach B requires N−K additional delay units when M is even and K additional delay units when M is odd. However, since delay units are relatively inexpensive, it is preferred that the one of Approaches A and B which has the least additive complexity is used.

Nth-Band Filters

Nth-band filters are commonly used for 1-to-N interpolators and for N-to-1 decimators and are sometimes referred to as Nyquist filters. An Nth-band filter has a center weight, i.e., $H_C$, and therefore has an odd length. In addition, an Nth-band filter includes weights $H_{C+Ni}$, whose values are zero for each positive or negative integer, i. The signal sample interpolation and decimation mechanisms described above are directly applicable to increasing efficiency of interpolators and decimators which use Nth-band filters.

The following example is illustrative. Consider a 4th-band interpolator with a weight filter H of 19 weights. The following equation (23) represents the derivation of interpolated signals Y0–Y3.

$$\begin{bmatrix} Y0 \\ Y1 \\ Y2 \\ Y3 \end{bmatrix} = \begin{bmatrix} H0 & H4 & H8 & H12 & H16 \\ H1 & H5 & H9 & H13 & H17 \\ H2 & H6 & H10 & H14 & H18 \\ H3 & H7 & H11 & H15 & 0 \end{bmatrix} \begin{bmatrix} X(N) \\ X(N-1) \\ X(N-2) \\ X(N-3) \\ X(N-4) \end{bmatrix} \quad (23)$$

The center weight is weight H9, and weight filter H is centrosymmetric. Accordingly, equation (23) is equivalent to equation (24) below.

$$\begin{bmatrix} Y0 \\ Y1 \\ Y2 \\ Y3 \end{bmatrix} = \begin{bmatrix} H0 & H4 & H8 & H6 & H2 \\ H1 & H5 & H9 & H5 & H1 \\ H2 & H6 & H8 & H4 & H0 \\ H3 & H7 & H7 & H3 & 0 \end{bmatrix} \begin{bmatrix} X(N) \\ X(N-1) \\ X(N-2) \\ X(N-3) \\ X(N-4) \end{bmatrix} \quad (24)$$

Figure 8:
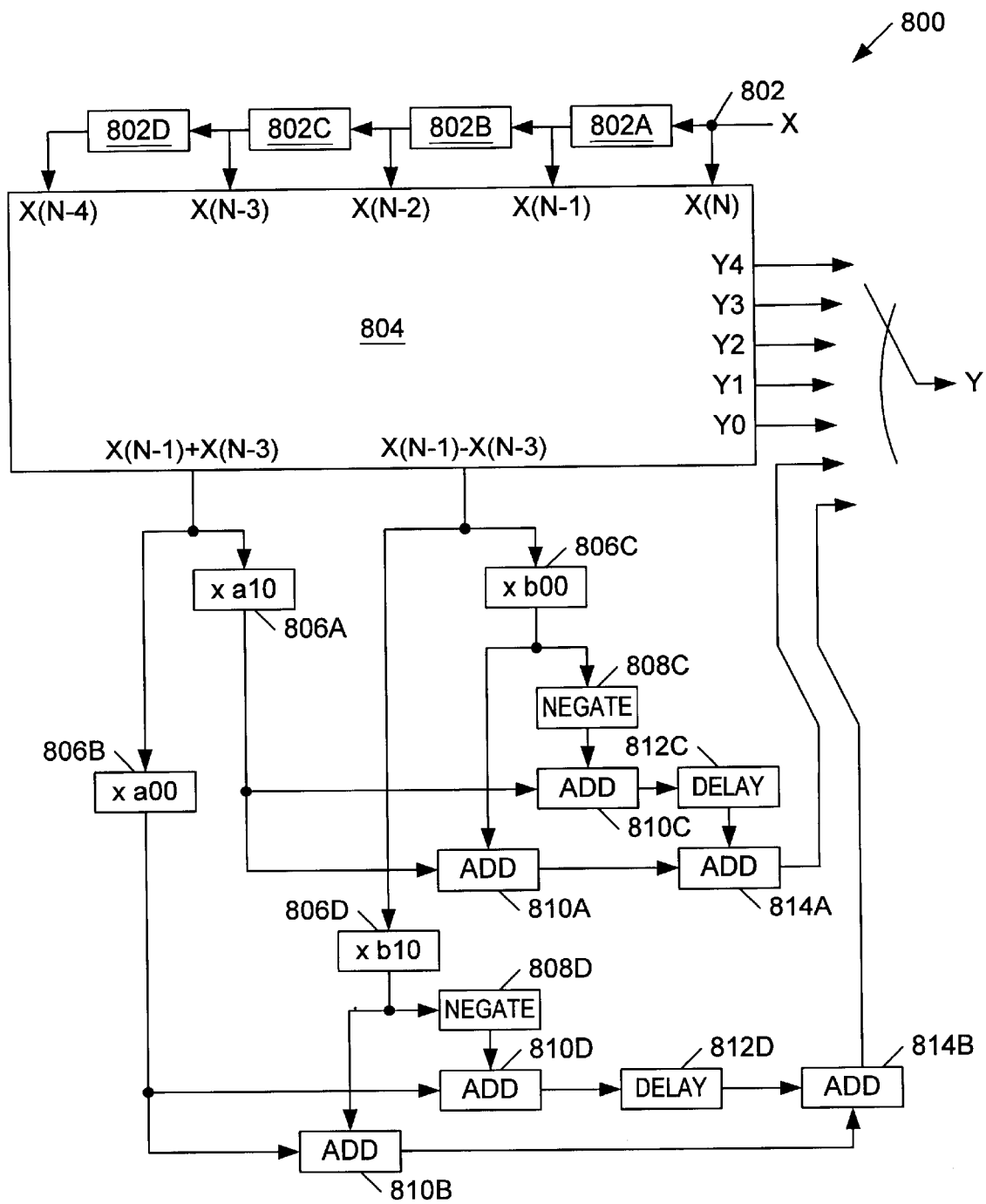
FIG. 8 is a block diagram of a 1-to-5 interpolator in accordance with the present invention in which additive complexity is reduced.

In equation (24), weight filter H has a length of L which is NM+K where N=4, M=4, and K=3. An interpolator can therefore be designed in accordance with equation (24) in the manner described above with respect to interpolators 700 (FIG. 7) and 800 (FIG. 8). In addition, weights H1 and H5 are equal to zero since N=4 and $H_{9\pm Ni}=0$ for each integer, i. Accordingly, equation (24) is equivalent to equation (25) below.

$$\begin{bmatrix} Y0 \\ Y1 \\ Y2 \\ Y3 \end{bmatrix} = \begin{bmatrix} H0 & H4 & H8 & H6 & H2 \\ 0 & 0 & H9 & 0 & 0 \\ H2 & H6 & H8 & H4 & H0 \\ H3 & H7 & H7 & H3 & 0 \end{bmatrix} \begin{bmatrix} X(N) \\ X(N-1) \\ X(N-2) \\ X(N-3) \\ X(N-4) \end{bmatrix} \quad (25)$$

It should be noted that the first and third rows of weight matrix H are symmetrical with respect to one another and therefore readily lend themselves to the improvements in efficiency described above with respect to interpolators 300 (FIG. 3) and 400 (FIG. 4). In addition, the second and fourth rows of weight matrix H are each individually symmetrical and therefore readily lend themselves to improvements in efficiency described above with respect to interpolator 400 (FIG. 4). Furthermore, weight H8 is applied to source sample X(N−2) in deriving both interpolated samples Y0 and Y2. Accordingly, analogous improvements in efficiency described above with respect to interpolator 400 (FIG. 4) are also applicable to an interpolator designed in accordance with equation (25).

The above description is illustrative only and is not limiting. The present invention is limited only by the claims which follow.

What is claimed is:

1. A computer program product comprising a computer readable medium having computer readable code embodied therein for computing M output samples in response to N input samples according to a centrosymmetric filter having L weights, wherein the remainder R of L divided by M is a positive integer, wherein the computer readable code is executable to implement:

(a) filtering the N input samples with a first weight sub-filter to produce R output samples of said M output samples, wherein the first weight sub-filter has L1 weights, wherein L1=R*N, wherein the L1 weights of the first weight sub-filter comprise a first subset of the L weights of the centrosymmetric filter; and (b) filtering the N input samples with a second weight sub-filter to produce a remnant of said M output samples, wherein the second weight sub-filter has L2 weights, wherein L2=(M−R)*(N−1), wherein the L2 weights of the second weight sub-filter comprise a second subset of the L weights of the centrosymmetric filter;

wherein the N input samples are representative of a signal at a first sample rate, and the M output samples are representative of the signal at a second sample rate.

2. The computer program product of claim 1, wherein at least one of (a) and (b) comprises:

adding a first sample and a second sample of said N input samples to generate a first intermediate value;

subtracting the first sample and the second sample to generate a second intermediate value;

multiplying the first intermediate value by a first coefficient to generate a first resultant value;

multiplying the second intermediate value by a second coefficient to generate a second resultant value;

generating a first sum including the first resultant value;

generating a second sum including the second resultant value;

adding the first sum and the second sum to generate a first of said M output samples;

subtracting the first sum and the second sum to generate a second of said M output samples.

3. The computer program product of claim 2, wherein the first coefficient equals (A+B)/2 and the second coefficient equals (A−B)/2, where A and B are two of the L weights of said centrosymmetric filter.

4. The computer program product of claim 1, wherein said signal is a recorded seismic signal, a video signal or an audio signal.

5. A distribution system for distributing program code, wherein the program code is executable by a computer and stored in a computer-readable memory, wherein the program code is configured to compute M output samples in response to N input samples according to a centrosymmetric filter having L weights, wherein the remainder R of L divided by M is a positive integer, wherein the computer readable code is executable to implement:

(a) filtering the N input samples with a first weight sub-filter to produce R samples of said M output samples, wherein the first weight sub-filter has L1 weights, wherein L1=R*N, wherein the L1 weights of the first weight sub-filter comprise a first subset of the L weights of the centrosymmetric filter; and (b) filtering the N input samples with a second weight sub-filter to produce a remnant of said M output samples, wherein the second weight sub-filter has L2 weights, wherein L2=(M−R)*(N−1), wherein the L2 weights of the second weight sub-filter comprise a second subset of the L weights of the centrosymmetric filter;

wherein the N input samples are representative of a signal sampled at a first sample rate, wherein the M output samples are representative of said signal at a second sample rate.

6. The distribution system of claim 5, wherein at least one of (a) and (b) comprises:

adding a first sample and a second sample of said N input samples to generate a first intermediate value;

subtracting the first sample and the second sample to generate a second intermediate value;

multiplying the first intermediate value by a first coefficient to generate a first resultant value;

multiplying the second intermediate value by a second coefficient to generate a second resultant value;

generating a first sum including the first resultant value;

generating a second sum including the second resultant value;

adding the first sum and the second sum to generate a first of said M output samples;

subtracting the first sum and the second sum to generate a second of said M output samples.

7. The distribution system of claim 6, wherein the first coefficient equals (A+B)/2 and the second coefficient equals (A−B)/2, where A and B are two of the L weights of said centrosymmetric filter.

8. The distribution system of claim 5, wherein said signal is a recorded seismic signal, a video signal or an audio signal.

9. A method for computing M output samples in response to N input samples according to a centrosymmetric filter having L weights, wherein the remainder R of L divided by M is a positive integer, wherein the method comprises:

receiving N input samples from an input buffer;

(a) filtering the N input samples with a first weight sub-filter to produce R output samples of said M output samples, wherein the first weight sub-filter has L1 weights, wherein L1=R*N, wherein the L1 weights of the first weight sub-filter comprise a first subset of the L weights of the centrosymmetric filter; and (b) filtering the N input samples with a second weight sub-filter to produce a remnant of said M output samples, wherein the second weight sub-filter has L2 weights, wherein L2=(M−R)*(N−1), wherein the L2 weights of the second weight sub-filter comprise a second subset of the L weights of the centrosymmetric filter;

storing the M output samples in an output buffer;

wherein the N input samples are representative of a signal at a first sample rate, and the M output samples are representative of the signal at a second sample rate.

10. The method of claim 9, wherein at least one of (a) and (b) comprises:

adding a first sample and a second sample of said N input samples to generate a first intermediate value;

subtracting the first sample and the second sample to generate a second intermediate value;

multiplying the first intermediate value by a first coefficient to generate a first resultant value;

multiplying the second intermediate value by a second coefficient to generate a second resultant value;

generating a first sum including the first resultant value;

generating a second sum including the second resultant value;

adding the first sum and the second sum to generate a first of said M output samples;

subtracting the first sum and the second sum to generate a second of said M output samples.

11. The method of claim 10, wherein the first coefficient equals (A+B)/2 and the second coefficient equals (A−B)/2, where A and B are two of the L weights of said centrosymmetric filter.

12. The method of claim 9, wherein said signal is a recorded seismic signal, a video signal or an audio signal.

13. A signal processor for computing M output samples in response to N input samples according to a centrosymmetric filter having L weights, wherein the remainder R of L divided by M is a positive integer, wherein the signal processor comprises:

a first processing unit configured to filter the N input samples with a first weight sub-filter to produce R output samples of said M output samples, wherein the first weight sub-filter has L1 weights, wherein L1=R*N, wherein the L1 weights of the first weight sub-filter comprise a first subset of the L weights of the centrosymmetric filter; and a second processing unit configured to filter the N input samples with a second weight sub-filter to produce a remnant of said M output samples, wherein the second weight sub-filter has L2 weights, wherein L2=(M−R)*(N−1), wherein the L2 weights of the second weight sub-filter comprise a second subset of the L weights of the centrosymmetric filter;

wherein the N input samples are representative of a signal at a first sample rate, and the M output samples are representative of the signal at a second sample rate.

14. The signal processor of claim 13, wherein at least one of the first processing unit and the second processing unit comprises:

a first adder configured to add a first sample and a second sample of said N input samples to generate a first intermediate value;

a second adder configured to subtract the first sample and the second sample to generate a second intermediate value;

a first multiplier configured to multiply the first intermediate value by a first coefficient to generate a first resultant value;

a second multiplier configured to multiply the second intermediate value by a second coefficient to generate a second resultant value;

a first adder network configured to generate a first sum which includes the first resultant value;

a second adder network configured to generate a second sum which includes the second resultant value;

a third adder configured to add the first sum and the second sum to generate a first of said M output samples;

a fourth adder configured to subtract the first sum and the second sum to generate a second of said M output samples.

15. The signal processor of claim 14, wherein the first coefficient equals (A+B)/2 and the second coefficient equals (A−B)/2, wherein A and B are two of the L weights of said centrosymmetric filter.

16. The signal processor of claim 13, wherein said signal is a recorded seismic signal, a video signal or an audio signal.

17. A computer system for computing M output samples in response to N input samples according to a centrosymmetric filter having L weights, wherein the remainder R of L divided by M is a positive integer, wherein the computer system comprises:

a computer processor;

a memory operatively coupled to the computer processor, wherein the memory stored a signal processing program;

wherein, in response to an execution of the signal processing program, said computer processor is operable to:

receive said N input samples from an input buffer;

(a) filter the N input samples with a first weight sub-filter to produce R output samples of said M output samples, wherein the first weight sub-filter has L1 weights, wherein L1=R*N, wherein the L1 weights of the first weight sub-filter comprise a first subset of the L weights of the centrosymmetric filter; and (b) filter the N input samples with a second weight sub-filter to produce a remnant of said M output samples, wherein the second weight sub-filter has L2 weights, wherein L2=(M−R)*(N−1), wherein the L2 weights of the second weight sub-filter comprise a second subset of the L weights of the centrosymmetric filter;

store the M output samples in an output buffer;

wherein the N input samples are representative of a signal at a first sample rate, and the M output samples are representative of the signal at a second sample rate.

18. The computer system of claim 17, wherein, in response to said execution of the signal processing program, the computer processor is operable to perform at least one of (a) and (b) by:

adding a first sample and a second sample of said N input samples to generate a first intermediate value;

subtracting the first sample and the second sample to generate a second intermediate value;

multiplying the first intermediate value by a first coefficient to generate a first resultant value;

multiplying the second intermediate value by a second coefficient to generate a second resultant value;

generating a first sum including the first resultant value;

generating a second sum including the second resultant value;

adding the first sum and the second sum to generate a first of said M output samples;

subtracting the first sum and the second sum to generate a second of said M output samples.

19. The computer system of claim 18, wherein the first coefficient equals (A+B)/2 and the second coefficient equals (A−B)/2, where A and B are two of the L weights of said centrosymmetric filter.

20. The computer system of claim 17, wherein said signal is a recorded seismic signal, a video signal or an audio signal.

* * * * *